(12) United States Patent
Shin

(10) Patent No.: US 7,978,188 B2
(45) Date of Patent: Jul. 12, 2011

(54) DATA DRIVER AND ORGANIC LIGHT EMITTING DISPLAY USING THE SAME

(75) Inventor: Dong Yong Shin, Seoul (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 1155 days.

(21) Appl. No.: 11/717,038

(22) Filed: Mar. 13, 2007

(65) Prior Publication Data

US 2007/0216612 A1 Sep. 20, 2007

(30) Foreign Application Priority Data

Mar. 14, 2006 (KR) .......................... 10-2006-0023691

(51) Int. Cl.
*G06F 3/038* (2006.01)
*G09G 5/00* (2006.01)
*G09G 3/14* (2006.01)
*G09G 3/32* (2006.01)

(52) U.S. Cl. .............................. 345/204; 345/39; 345/82

(58) Field of Classification Search .................... 345/39, 345/82, 83, 87–111, 204–207
See application file for complete search history.

(56) References Cited

U.S. PATENT DOCUMENTS 7,180,479 B2 * 2/2007 Kimura ........................... 345/60

FOREIGN PATENT DOCUMENTS

KR 2005-0111919 11/2005

* cited by examiner

*Primary Examiner* — Srilakshmi K Kumar
(74) *Attorney, Agent, or Firm* — Lee & Morse, P.C.

(57) ABSTRACT

A data driving circuit including n channels, where n is an integer, the data driving circuit including a shift register unit receiving data during a first input period and a second input period, the shift register unit shifting and outputting the received data, a first latch unit receiving the data input during the first input period from the shift register unit, and simultaneously or substantially simultaneously outputting the data corresponding to the first input period, and a second latch unit receiving the data input during the second input period from the shift register unit, and simultaneously or substantially simultaneously outputting the data corresponding to the second input period.

22 Claims, 11 Drawing Sheets

DATA DRIVER AND ORGANIC LIGHT EMITTING DISPLAY USING THE SAME

BACKGROUND OF THE INVENTION

1. Field of the Invention

The present invention relates to a data driver and an organic light emitting display using the same. More particularly, the present invention relates to a shift register and/or a data driver including only p-type transistors, e.g., PMOS transistors, and an organic light emitting display using the same.

2. Description of the Related Art

Various types of flat panel displays have been developed. Such flat panel displays may be advantageous over cathode ray tube (CRT) displays. For example, flat panel displays may be manufactured to be lighter, thinner and to have lower volume than CRTs. Examples of flat panel display devices include liquid crystal displays (LCDs), field emission displays, plasma display panels (PDPs) and light emitting displays. Further, e.g., organic light emitting displays are one type of light emitting displays.

Organic light emitting displays may display an image using an organic light emitting diode (OLED), which generates light by recombining electrons and holes. Organic light emitting displays may have advantages such as relatively low power consumption and/or relatively fast response speeds.

Organic light emitting displays may include pixels arranged in a matrix form, a data driver for driving data lines connected to the pixels, and a scan driver for driving scan lines connected to the pixels.

The data driver may allow a predetermined image to be displayed in the pixels by supplying data signals corresponding to data during every horizontal period. The scan driver may select pixels to which data signals are supplied, by sequentially supplying scan signals during every horizontal period.

As organic light emitting display panels become larger and larger, it may be advantageous to mount the data driver on the panel in order to reduce a size, a weight and a manufacturing expense of the organic light emitting display. However, it is difficult for a conventional data driver configured of both PMOS transistors and NMOS transistors to be mounted on the panel. Therefore, a data driver, which is mountable on the panel and/or is configured of PMOS transistors, i.e., only PMOS transistors is desired.

SUMMARY OF THE INVENTION

The present invention is therefore directed to a data driver, and a display including such a shift register and/or data driver, which substantially overcome one or more of the problems due to limitations and disadvantages of the related art.

It is therefore a feature of an embodiment of the present invention to provide a shift register and a data driver configured of PMOS type transistors, and an organic light emitting display using the same.

At least one of the above and other features and advantages of the present invention may be realized by providing a data driving circuit including n channels, where n is an integer, the data driving circuit including a shift register unit receiving data during a first input period and a second input period, the shift register unit shifting and outputting the received data, a first latch unit receiving the data input during the first input period from the shift register unit, and simultaneously or substantially simultaneously outputting the data corresponding to the first input period, and a second latch unit receiving the data input during the second input period from the shift register unit, and simultaneously or substantially simultaneously outputting the data corresponding to the second input period.

The shift register unit may include 2n shift registers connected in series. The first shift register may receives a data signal, and the second to the 2n shift registers may receive an output signal of a previous shift register.

Among the plurality of 2n shift registers, odd numbered ones of the shift registers receive a first clock signal through a first clock terminal thereof and receive a second clock signal through a second clock terminal thereof, and even numbered ones of the registers receive the second clock signal through a first clock terminal thereof and receive the first clock signal through a second clock terminal thereof.

Each of the 2n shift registers may include a first transistor receiving the data at a first electrode thereof and having a gate connected to a first clock terminal, a second transistor connected between a second clock terminal and an output terminal and having a gate connected with a second electrode of the first transistor, a third transistor and a fourth transistor connected between the first clock terminal and a second power source, a first electrode of the third transistor being connected to a first electrode of the fourth transistor, a gate of the fourth transistor being connected to the second terminal of the first transistor, and a gate electrode of the third transistor being connected to the first clock terminal, a fifth transistor connected between a first power source and an output terminal out and having a gate connected to the first electrodes of the third and fourth transistors, and a capacitor connected between the gate and the output terminal.

The data may be an externally supplied data signal or an output of a previous one of the shift registers. Each of the first, second, third, fourth and fifth transistors are p-type transistors. The first latch unit and the second latch unit may each include n latches and receive, as input signals thereto, respective outputs of odd numbered ones of the 2n shift registers of the shift register unit.

Each of the latches may include a transfer unit for storing and then outputting an input signal input thereto, an inversion unit for storing and inversing the input signal input to the transfer unit and outputting the inversed input signal, and a buffer unit, including a pull-up transistor and a pull-down transistor, for selecting a signal output from at least one of the transfer unit and the inversion unit and outputting the selected signal.

Each of the latches may include a first transistor receiving the respective input signal at a first electrode thereof, the first transistor including a gate connected to a first clock terminal, a second transistor connected between a first power source and a first node and having a gate connected with the first clock terminal, a third transistor connected between a second clock terminal and the first node and having a gate connected with a second electrode of the first transistor, a fourth transistor connected between a second power source and a third node and having a gate connected with the first clock terminal, a fifth transistor connected between the first clock terminal and the third node and having a gate connected with the second electrode of the first transistor, a sixth transistor connected between the second clock terminal and a second node and having a gate connected with the third node, a seventh transistor connected between the second power source and an output terminal and having a gate connected with the first node, and an eighth transistor connected between the first power source and the output terminal and having a gate connected with the second node.

Each of the first, second, third, fourth, fifth, sixth, seventh, eighth and ninth transistors may be a p-type transistor. Each of the latches may further include a first capacitor connected between the second electrode of the first transistor and the first node, and a third capacitor connected between the second node and the third node.

Each of the latches may further include a second capacitor connected between the first node and the second power source, and a third capacitor connected between the second node and the second power source. Each latch provided in the first latch unit may receive a first enable signal and a second enable signal, and each latch provided in the second latch unit receives a third enable signal and a fourth enable signal.

The first enable signal and the second enable signal may sustain a low level and a high level, respectively, during all or substantially all of the first input period, and may sustain a high level and a low level, respectively, during all or substantially all of the second input period. The first latch unit may simultaneously or substantially simultaneously output the data corresponding to the first input period during the second input period when the first enable signal and the second enable signal are at a high level and a low level, respectively. The third enable signal and the fourth enable signal may sustain a low level and a high level, respectively, during all or substantially all of the second input period, and may sustain a high level and a low level, respectively, during all or substantially all of a third input period.

The second latch unit may simultaneously or substantially simultaneously output the data corresponding to the second input period during the third input period when the third enable signal and the fourth enable signal are at a high level and a low level, respectively. During the first period, the first enable signal may be at the low level only for a period when a first data of the data input during the first input period is output by the 2n-1 shift register of the 2n shift registers, and during the second period, the third enable signal may be at the low level only for a period when a first data of the data input during the second input period is output by the 2n-1 shift register of the 2n shift registers.

The second enable signal and the fourth enable signal may maintain a low level at different periods in time. The shift register unit may include a first shift register unit for outputting first sampling pulses corresponding to the data received during the first input period based on a first clock signal, a second clock signal and a first start pulse, and a second shift register unit for outputting second sampling pulses corresponding to the data received during the second input period based on a third clock signal, a fourth clock signal and a second start pulse, and wherein the first latch unit may simultaneously or substantially simultaneously outputs data corresponding to the first input period in accordance with a first enable signal and the first sampling pulses from the first shift register unit, and the second latch unit may simultaneously or substantially simultaneously output data corresponding to the second input period in accordance with a second enable signal and the second sampling pulses from the second shift register unit.

The first shift register may include n shift registers connected in series, a first shift register thereof receiving each first start pulse and the second to the nth shift registers receiving the respective sampling pulse of a previous one of the shift registers, and the second shift register may include n shift registers connected in series, a fist shift register thereof may receive each second start pulse, and the second to the nth shift registers may receive the respective sampling pulse of a previous one of the shift registers.

The first latch unit may include a plurality of latches and each of the latches outputs data input during the first input period in accordance with the first sampling pulses and the first enable signal, and the second latch unit may include a plurality of latches and each of the latches outputs data input during the second input period in accordance with the second sampling pulses and the second enable signal.

At least one of the above and other features and advantages of the present invention may be realized by providing an organic light emitting display including a scan driver for sequentially supplying scan signals to scan lines, a data driver for supplying a first data signal or a second data signal to respective data lines, and pixels selected when the scan signals are supplied and controlled to emit or not emit light based on whether the first data signal or the second data signal is respectively supplied thereto, wherein the data driver may include a shift register unit receiving data during a first input period and a second input period, the shift register unit shifting and outputting the received data, a first latch unit receiving the data input during the first input period from the shift register unit, and simultaneously or substantially simultaneously outputting the data corresponding to the first input period, and a second latch unit receiving the data input during the second input period from the shift register unit, and simultaneously or substantially simultaneously outputting the data corresponding to the second input period.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
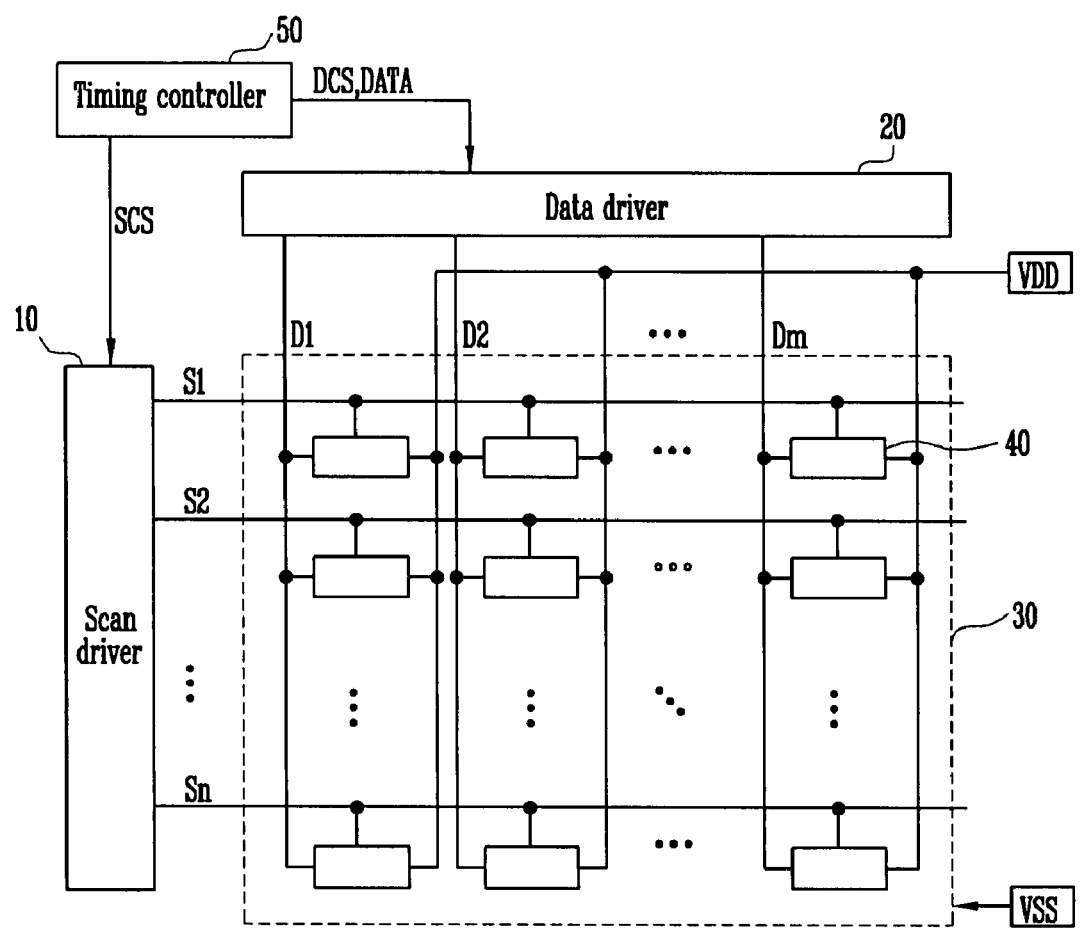
FIG. 1 illustrates a circuit diagram of an exemplary organic light emitting display employing one or more aspects of the present invention.

Korean Patent Application No. 10-2006-0023691, filed on Mar. 14, 2006, in the Korean Intellectual Property Office, and entitled: "Data Driver and Organic Light Emitting Display Using the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout the specification.

Hereinafter, exemplary embodiments employing one or more aspects of the present invention, which can be easily carried out by those skilled in the art, will be described below with reference to the accompanying FIGS. 1 through 13.

FIG. 1 illustrates a circuit diagram of an exemplary organic light emitting display employing one or more aspects of the present invention.

Referring to FIG. 1, an organic light emitting display according to an embodiment of the present invention may include a pixel unit 30, a scan driver 10, a data driver 20 and a timing controller 50. The pixel unit 30 may include a plurality of pixels 40 connected with scan lines S1 to Sn and data lines D1 to Dm. The scan driver 10 may drive the scan lines S1 to Sn.

The data driver 10 may drive the data lines D1 to Dm. The timing controller 50 may control the scan driver 10 and the data driver 20.

The timing controller 50 may generate a data driving control signal DCS and a scan driving control signal SCS in accordance with externally supplied synchronizing signals. The data driving control signal DCS generated in the timing controller 50 may be supplied to the data driver 20, and the scan driving control signal SCS may be supplied to the scan driver 10. The timing controller 50 may also supply data DATA to the data driver 20 in accordance with externally supplied data.

The data driver 20 may supply data signals to data lines D1 to Dm during each subframe of a frame. The data signals may include a first data signal for enabling the pixels 40 to emit light and a second data signal with which the pixels 40 cannot emit light. In other words, the data driver 20 may supply the first data signal or the second data signal to the data lines D1 to Dm to control whether or not the pixels 40 may emit light during each subframe.

The scan driver 10 may sequentially supply scan signals to the scan lines S1 to Sn during each subframe. More particularly, if the scan signals are sequentially supplied to the scan lines S1 to Sn, the pixels 40 may be sequentially selected per line, and the selected ones of the pixels 40 may receive the first data signal or the second signal supplied from the data lines D1 to Dm.

The pixel unit 30 may be supplied with a first power source voltage VDD and a second power source voltage VSS, and the pixel unit 30 may supply the first power source voltage VDD and the second power source voltage VSS to each of the pixels 40. The first power source voltage VDD and the second power source voltage VSS may be supplied by externally supplied power sources (not shown).

When a combination of the scan signals, the data signals, i.e., the first data signal or the second data signal, the first power source voltage VDD and/or the second power source voltage VSS is supplied to each of the pixels 40 during a subframe, each of the pixels may or may not emit light during the subframe based on, e.g., whether the first data signal or the second data signal was supplied thereto during the subframe.

Figure 2:
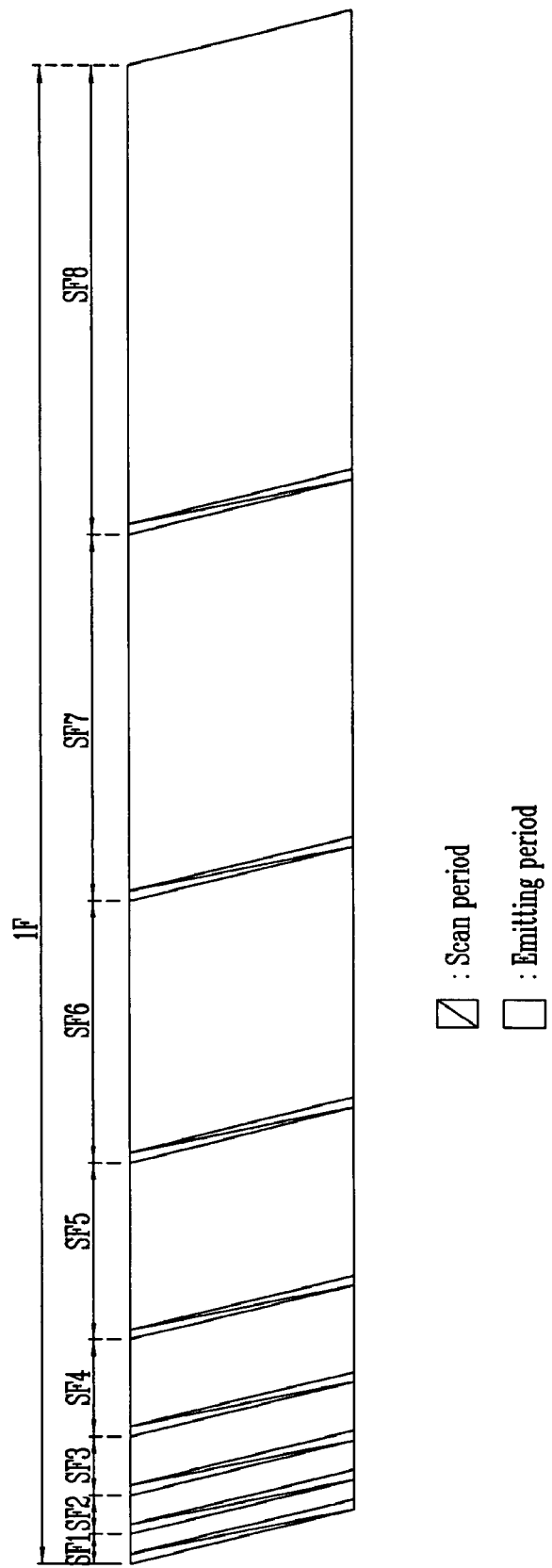
FIG. 2 illustrates a diagram of one exemplary frame of an organic light emitting display employing one or more aspects of the present invention.

FIG. 2 illustrates a diagram of one exemplary frame 1F of an organic light emitting display employing one or more aspects of the present invention.

More particularly, FIG. 2 illustrates the frame 1F divided into eight frames. However, the present invention is not limited thereto. Referring to FIG. 2, an organic light emitting display according to an embodiment of the present invention may be driven by dividing one frame 1F into a plurality of subframes SF1 to SF8. Each of the subframes SF1 to SF8 may be driven by dividing each of the subframes SF1 to SF8 into a scan period and an emitting period.

During the scan period of a subframe, the scan signals may be sequentially supplied to the scan lines S1 to Sn. During the scan period the data signals may be supplied to the data lines D1 to Dm to be synchronized with the scan signals. That is, during the scan period the pixels to be, turned on may be selected by the corresponding data signals.

During the emitting period, the pixels 40 may or may not emit light based on the data signals supplied during the scan period. The scan period may be set to be identical, e.g., same amount of time, for each of the subframes SF1 to SF8. The emitting period may be set to be different, e.g., different amounts of time, for each of the subframes SF1 to SF8. For example, the duration of the emitting period may increase by a ratio of $2^n$ (n=0, 1, 2, 3, 4, 5, 6, 7) from the first subframe SF1 to eighth subframe SF8. That is, in embodiments of the present invention, the pixels 40 may display an image of a predetermined gray scale by emitting or non-emitting light during each of the subframes SF1 to SF8 included in one frame 1F.

In embodiments of the present invention, each of the subframes SF1 to SF8 included in one frame 1F, e.g., the emitting period of each of the subframes SF1 to SF8, may be changed in various ways. For example, a reset period may be included in each of the respective subframes SF1 to SF8.

Figure 3:
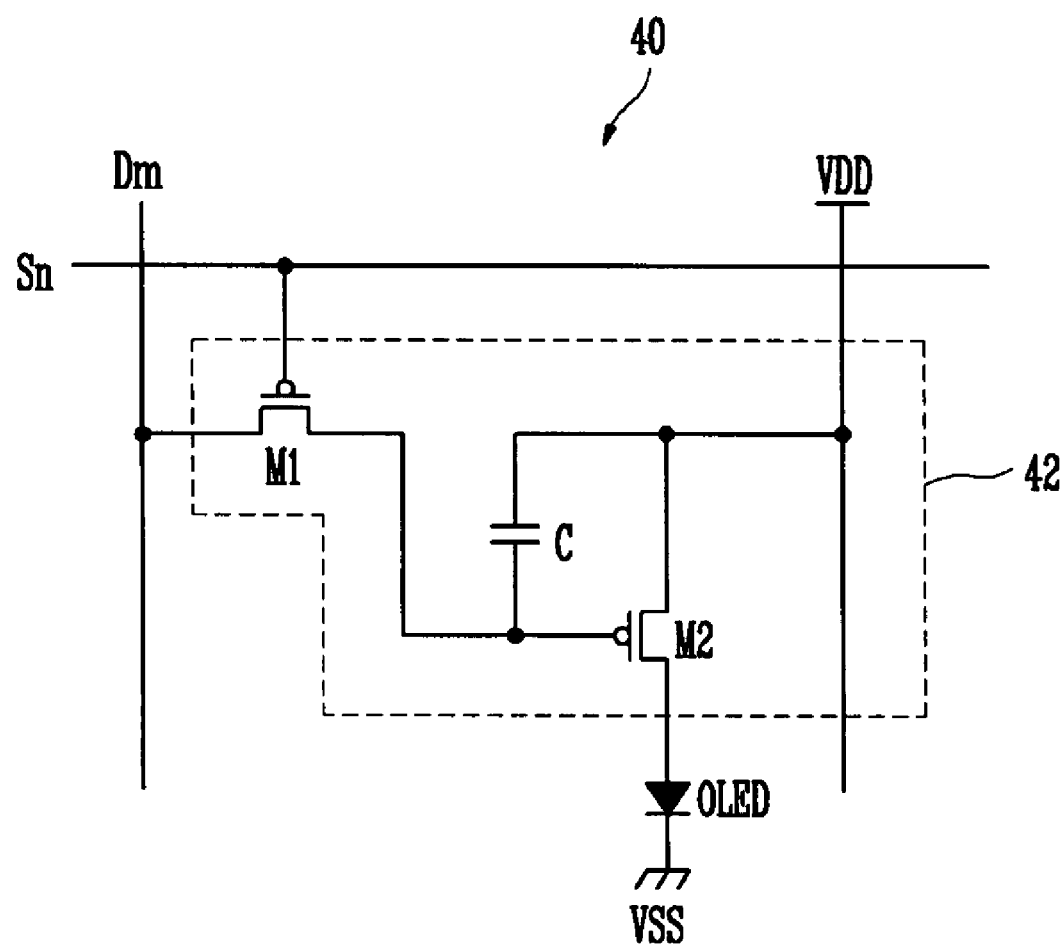
FIG. 3 illustrates a circuit diagram of an exemplary pixel employable by the organic light emitting display shown in FIG. 1.

FIG. 3 illustrates a circuit diagram of an exemplary pixel 40 employable by the organic light emitting display shown in FIG. 1. For purposes of description, the exemplary pixel 40 is illustrated in FIG. 3 and described below as connected with the $n^{th}$ scan line Sn and the $m^{th}$ data line Dm. However, one, some or all of the pixels 40 of an organic light emitting display may have one, some or all of the features described below with regard to the exemplary pixel 40.

Referring to FIG. 3, the pixel 40 employing one or more aspects of the invention may include a pixel circuit 42. The pixel circuit 42 may be connected with an organic light emitting diode OLED, the mth data line Dm and the nth scan line Sn to control whether or not the organic light emitting diode OLED emits light.

An anode electrode of the organic light emitting diode OLED may be connected with the pixel circuit 42, and a cathode electrode of the organic light emitting diode OLED may be connected to the second power source voltage VSS. Such an organic light emitting diode OLED may or may not emit light during each of the subframes SF1 to SF8 based on currents supplied thereto from the pixel circuit 42. When the scan signals are supplied to the scan line Sn, the pixel circuit 42 may control whether or not the organic light emitting diode OLED emits light based on the data signals supplied to the data line Dm.

In embodiments of the invention, the pixel circuit 42 may include a first transistor M1, a second transistor M2 and a capacitor C. A first electrode of the first transistor M1 may be connected to the mth data line, a gate electrode of the first transistor M1 may be connected to the nth scan line, and a second electrode of the first transistor M1 may be connected to a first electrode of the capacitor C and a gate electrode of the second transistor M2. Meanwhile, the first electrode of the first transistor M1 may be set to be either a source electrode or a drain electrode thereof, and the second electrode of the first transistor M2 may be set to be the other of the source electrode and the drain electrode, i.e., set to be different from the first electrode thereof. For example, if the first electrode is set to be the source electrode, the second electrode may be set to be the drain electrode of the first transistor M1.

A second electrode of the capacitor C may be connected to a first electrode of the second transistor M2, and the second electrode of the capacitor C and the first electrode of the second transistor M2 may be connected to the first power source voltage VDD. A second electrode of the second transistor M2 may be connected to the organic light emitting diode OLED.

When the scan signals are supplied to the scan line during the scan period of each of the subframes SF1 to SF8, the first transistor M1 may be turned on to supply the data signals supplied to the data line Dm to the capacitor C. The second transistor M2 may control whether or not the organic light emitting diode OLED emits light based on a voltage stored in the storage capacitor C. For example, when the voltage corresponding to the first data signal is charged in the storage capacitor C, the second transistor M2 may supply a predetermined current so that the organic light emitting diode OLED may emit light. When a voltage corresponding to the second data signal is charged in the storage capacitor C, the second transistor M2 may supply a current, e.g., little or no current, such that the organic light emitting diode OLED may not emit light.

Figure 4:
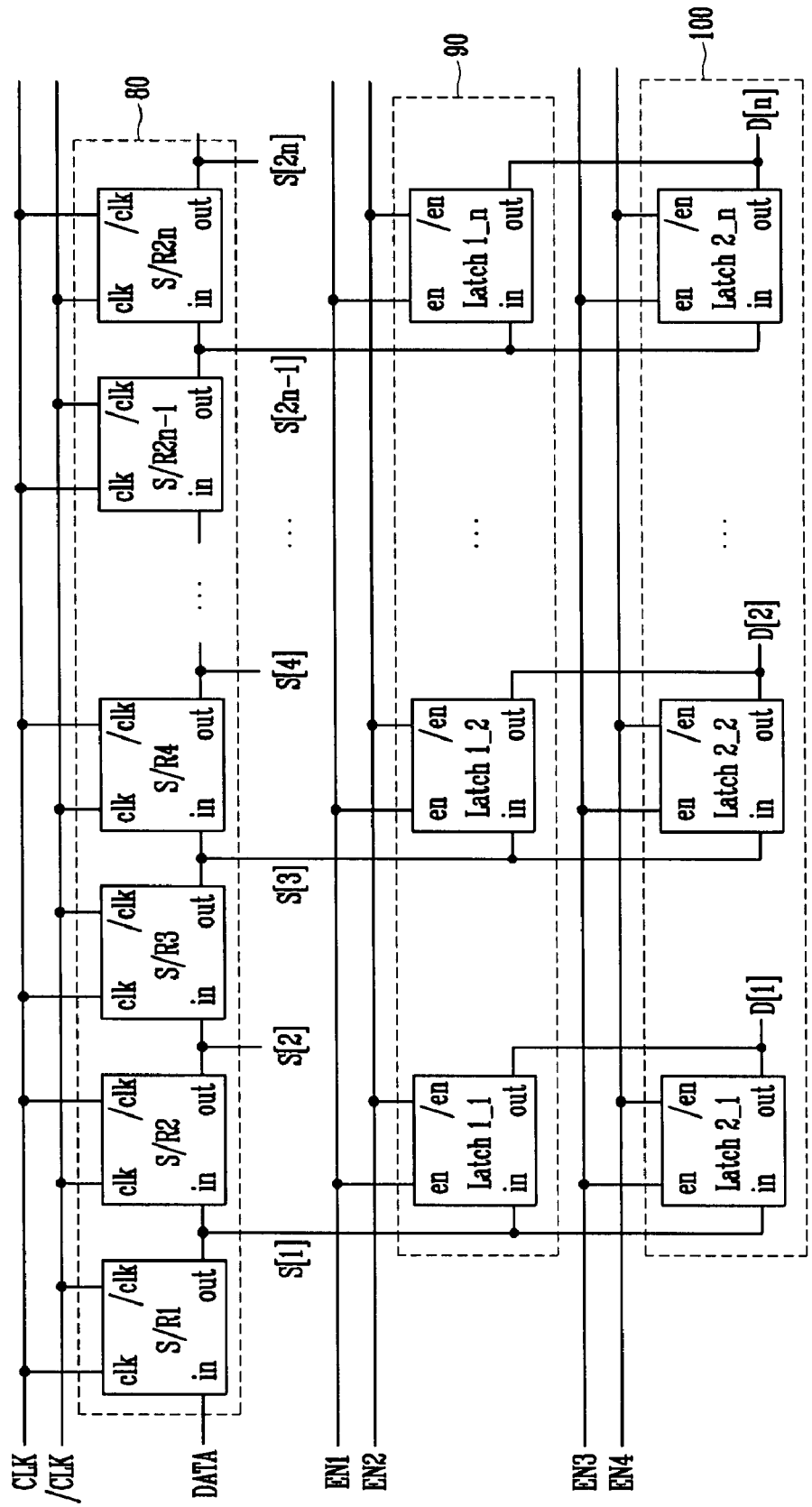
FIG. 4 illustrates a block diagram of a first exemplary embodiment of a data driving circuit employing one or more aspects of the present invention.
Figure 5:
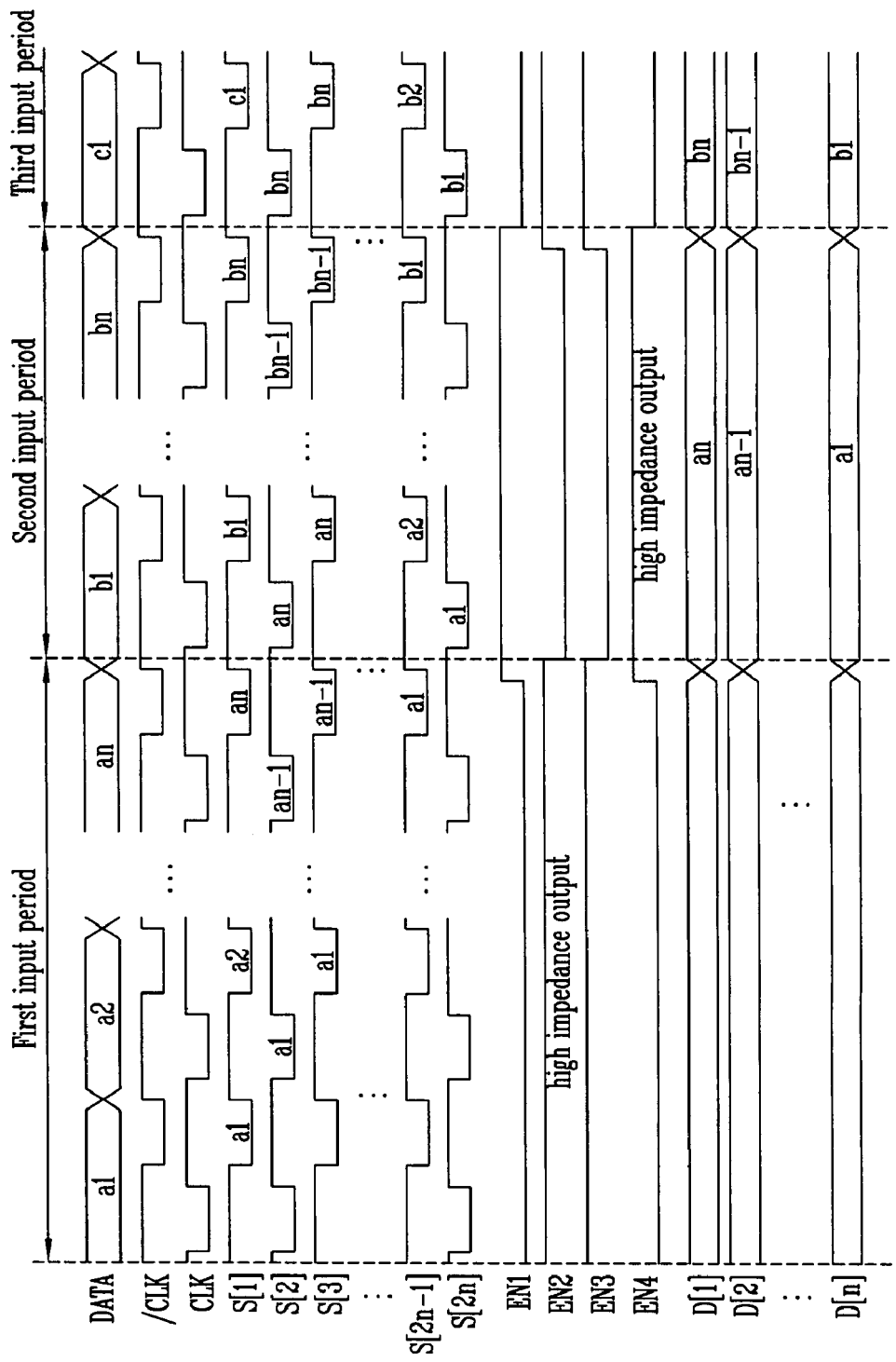
FIG. 5 illustrates an exemplary waveform diagram of signals employable by a first exemplary method for driving the data driving circuit shown in FIG. 4.

FIG. 4 illustrates a block diagram of a first exemplary embodiment of a data driving circuit employing one or more aspects of the present invention, and FIG. 5 illustrates an exemplary waveform diagram of signals employable by a first exemplary method for driving the data driving circuit shown in FIG. 4. For purposes of description, it is assumed that the data driving circuit illustrated in FIG. 4 includes n channels.

Referring to FIG. 4, a data driving circuit according to an embodiment of the present invention may include a shift register 80, a first latch unit 90 and a second latch unit 100. The shift register 80 may receive data via an input terminal (in) thereof, and may shift the input data to an output terminal (out) thereof. The first latch unit 90 may simultaneously or substantially simultaneously output data corresponding to data input during a first input period from the shift register. The second latch unit 100 may simultaneously output data corresponding to a second input period input from the shift register.

The shift register 80 may include 2n shift registers S/R1 to S/R2n connected in series. A first shift register S/R1 may receive a data signal, and the second to the 2nth shift registers S/R2 to S/R2n may receive an output signal of a previous one of the shift registers S/R1 to S/R2n-1.

Each of the shift registers S/R1 to S/R2n may receive a first clock signal CLK and a second clock signal /CLK. In embodiments of the invention, odd numbered ones S/R1, S/R3, ... S/Rn-1 of the shift registers S/R1 to S/R2n may receive a first clock signal CLK through a first clock terminal clk and may receive a second clock signal /CLK through a second clock terminal /clk, and even numbered ones S/R2, S/R4, S/R2n of the registers S/R1 to S/R2n may receive a second clock signal /CLK through a first clock terminal clk and receive a first clock signal CLK through a second clock terminal /clk.

Figure 6:
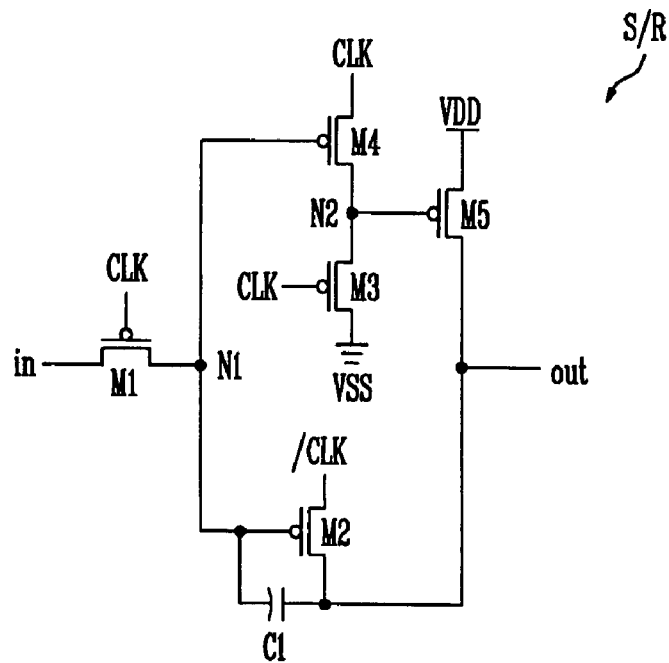
FIG. 6 illustrates a circuit diagram of an exemplary embodiment of a shift register employable by a shift register unit of the data driving circuit shown in FIG. 4.

FIG. 6 illustrates a circuit diagram of an exemplary embodiment of a shift register employable by a shift register unit of the data driving circuit shown in FIG. 4.

Referring to FIG. 6, the exemplary shift register S/R according to an embodiment of the present invention may include a first transistor M1, a second transistor M2, a third transistor M3, a fourth transistor M4, a fifth transistor M5 and a capacitor C1. The exemplary shift register S/R may correspond to one, some or all of the shift registers S/R1 to SR2n of the shift register unit 80 shown in FIG. 4.

A first electrode of the first transistor M1 may receive an input signal, e.g., a data signal or an output of a previous one of the shift registers S/R1 to S/R2n-1. A gate electrode of the first transistor M1 may be connected with a first clock terminal clk of the shift register S/R, and may receive the first clock signal CLK. A second terminal of the first transistor may be connected to a first node N1.

A first electrode of the capacitor C1 may be connected to the first node N1. A second electrode of the capacitor C1 may be connected to an output terminal (out) of the shift register S/R.

A first electrode of the second transistor M2 may be connected to a second clock terminal /clk of the shift register S/R, and may receive the second clock signal /CLK. A gate electrode of the second transistor M2 may be connected to the first node N1. A second electrode of the second transistor M2 may be connected to the second terminal of the capacitor C1 and the output terminal (out) of the shift register S/R.

A first electrode of the third transistor M3 may be connected to a second node N2 of the shift register S/R. A second electrode of the third transistor M3 may be connected to the second power source voltage VSS. A gate electrode of the third transistor M3 may be connected to the first clock terminal clk of the shift register S/R, and may receive the first clock signal CLK.

A first electrode of the fourth transistor M4 may be connected to the first clock terminal clk, and may receive the first clock signal CLK. A second electrode of the fourth transistor M4 may be connected to the second node N2. A gate electrode of the fourth transistor M4 may be connected to the first node N1.

A gate electrode of the fifth transistor M5 may be connected to the second node N2. A first electrode of the fifth transistor M5 may be connected to the first power source voltage VDD. A second electrode of the fifth transistor M5 may be connected to the output terminal (out) of the shift register S/R.

In embodiments of the invention, the first transistor M1 to the fifth transistor M5 may be PMOS. The first power source voltage VDD may be set to be a higher voltage than the second power source voltage VSS. In embodiments of the invention, the second power source VSS may be a ground voltage GND.

The first electrode of the first transistor M1 may receive an input signal, e.g., a data signal or an output signal of a previous shift register S/R. The first transistor M1 may be turned on or turned off in accordance with a state of the first clock signal CLK or the second clock signal /CLK supplied to the first clock terminal clk thereof.

The second transistor M2 may be turned on or turned off in accordance with a voltage applied to the first node N1. The third transistor M3 may be turned on or turned off in accordance with a state of the first clock signal CLK or the second clock signal CLK supplied to the first clock terminal clk thereof.

The fourth transistor M4 may be turned on or turned off in accordance with the voltage applied to the first node N1. The fifth transistor M5 may be turned on or turned off in accordance with the voltage applied to the second node N2. When the first transistor M1 is turned on, the capacitor C1 may be charged with a voltage corresponding to the input signal applied to the first node N1.

Exemplary operation of the shift register will be described below.

For description purposes, the exemplary operation will be described assuming that the shift register S/R shown in FIG. 6 is the first shift register S/R1 of the plurality of shift registers S/R1 to S/R2n.

Referring to FIG. 5, during the first input period, the first clock signal CLK may be at a low level while the second clock signal /CLK is at a high level. It will be assumed that a first data signal (a1) input during the first input period has a low level. Under such circumstances, i.e., the first cock signal CLK at a low level, the second clock signal /CLK at a high level and the input signal at a low level (the first data signal (a1) input during a first input period is at low level), the first transistor M1 and the third transistor M3 receiving the first clock signal CLK of a low level may be turned on. If the first transistor M1 is turned on, the input signal may be supplied to the first node N1. In this case, the second transistor M2 and the fourth transistor M4 may be turned on.

If the fourth transistor M4 is turned on, the first clock signal CLK of a low level may be supplied to the second node N2. Also, if the third transistor M3 is turned on, the second power source voltage VSS may be supplied to the second node N2. In this case, the fifth transistor M5 may be turned on and the first power source voltage VDD may be supplied to the output terminal (out). Meanwhile, if the second transistor M2 is turned on, the second clock signal /CLK of a high level may be supplied to the output terminal (out).

At this time, the capacitor C1 may be charged with a voltage corresponding to the difference between the first node N1 and the output terminal (out). For example, the capacitor C1 may be charged with the voltage corresponding to the difference between a low voltage of the input signal and the first power source voltage VDD.

Thereafter, as shown in FIG. 5, the first clock signal CLK and the second clock signal /CLK may be controlled to have a high level and a low level, respectively. As a result of the first clock signal CLK having the high level, the first transistor M1 and the third transistor M3 may be turned off, and a path of the input signal to the first node N1 may be stopped. At this time, the first node N1 may be set to a low level in accordance with the voltage charged in the capacitor C1. Then, the second transistor M2 may be turned on and thereby, a voltage of the output terminal (out) may fall to the voltage of the low level of the second clock signal /CLK. That is, as shown in FIG. 5, the data signal (a1), i.e., the input signal, which may have been stored in the capacitor C1 may be output as a first shift register output signal S[1].

Meanwhile, if the first node N1 is set to be a low level, the fourth transistor M4 may be turned on. If the fourth transistor M4 is turned on, the first clock signal CLK of a high level may be supplied to the second node N2 and the fifth transistor M5 may be turned off.

Thereafter, the second clock signal /CLK and the first clock signal CLK may be changed to have a high level and a low level, respectively. At this time, the first transistor M1 and the third transistor M3 receiving the first clock signal CLK of a low level may be turned on. If the third transistor M3 is turned on, the second power source voltage VSS may be supplied to the second node N2 and may turn on the fifth transistor M5, and the first power source voltage VDD may be supplied to the output terminal (out) accordingly.

If the first transistor M1 is turned on in a state where the input signal having a low level voltage is not being supplied, i.e., a voltage at the input terminal (in) of the shift register S/R1 may be at a high voltage level, and a voltage of a high level may be supplied to the first node N1. In such a state, the capacitor C1 may not charged with a voltage. Accordingly, even though the phase of the next clock signals CLK1 and CLK2 is inversed such that the first transistor M1 may be on in response to the first clock signal CLK having a low level, the second transistor M2 and the fourth transistor M4 may sustain a turned-off state, and the shift register S/R1 may sustain an output of a high state accordingly.

In embodiments of the invention, a gap or time delay may be generated between respective output pulses of subsequently operated ones of the shift registers S/R1 to S/R2n in accordance with time periods during which the first and second clock signals CLK, /CLK overlap at a high level, e.g. periods during which both the first and second clock signal CLK, /CLK are at a high level state.

In some embodiments of the invention, when the first clock signal CLK is at low level and the second clock signal /CLK is at a high level, odd numbered ones S/R1, S/R3, ... S/Rn-1, etc., of the shift registers S/R to S/R2n shown in FIG. 5 may output a high level as a precharge interval, and when the first clock signal CLK is a high level and the second clock signal /CLK is a low level, the odd numbered ones S/R1, S/R3, ... S/Rn-1, etc., of the shift registers S/R to S/R2n may perform an operation to output a waveform identical to that of the input signal input and stored during the previous interval.

Also, when the second clock signal /CLK is at a low level and the first clock signal CLK is at a high level, even numbered ones S/R2, S/R4, ... S/R2n of the shift registers S/R to S/R2n may output a high level as a precharge interval, and when the second clock signal /CLK is at a high level and the first clock signal CLK is at a low level, the even numbered ones S/R2, S/R4, ... S/R2n of the shift registers S/R to S/R2n may perform an operation to output a waveform identical to that of the input signal input and stored during the previous interval.

In some embodiments of the invention, when the first clock signal CLK and the second clock signal /CLK overlap at a high level, a gap or time delay may be generated between respective output pulses of subsequently operated ones of the shift registers S/R1 to S/R2n in accordance with the time period during which the first and second clock signals CLK, /CLK overlap at a high level, e.g. the period during which both the first and second clock signal CLK, /CLK are at a high level state.

The first shift register output signal S[1] will be described below with reference to FIG. 5, as an exemplary shift register output signal. Referring to FIG. 5, when a first data signal (a1) is input, the data signal (a1) may be output during an interval in which the second clock signal /CLK may be at a low level and the first clock signal CLK may be at a high level. A high level may be output during a precharge interval in which the second clock signal /CLK is at a high level and the first clock signal CLK is at a low level. Also, a high level may be output during an interval in which the first and the second clock signals overlap at a high level.

Thereafter, as shown in FIG. 5, in the case that the first data signal to the nth data signals (a1 to an) are input, the data signals (a1 to an) may be output at a predetermined interval.

More particularly, e.g., with regard to the second shift register S/R2, which is an even numbered shift register and may receive an output signal of the first shift register S/R1, when a first data signal (a1) is input from the first shift register S/R1, the first data signal (a1) may be output during the interval in which the first clock signal CLK is at a low level and the second clock signal /CLK is at a high level, and a high level may be output as a precharge interval during the interval in which the first clock signal CLK is at a high level and the second clock signal /CLK is at a low level. Also, a high level may be output during the interval in which the first and the second clock signals CLK, /CLK are overlapped at a high level. Thereafter, in the case that the second data signal a2 to the nth data signal (an) are input, the second to nth data signals (a2 to an) may be output at a predetermined interval, as shown in FIG. 5. More particularly, as shown in FIG. 5, with regard to the second shift register S/R2, the second shift register S/R2 may output the first to n-1 data signals (a1 to an-1) during the first input period and may output the nth data signal (an) during the second input period.

The exemplary operations described above with regard to the first and second shift register S/R1, S/R2 may be performed in the rest of the odd numbered registers S/R3 to S/R2n-1 and the even numbered registers S/R4 to S/R2n, and the respective exemplary waveforms shown in FIG. 5 may be output.

In some embodiments of the invention, as shown in FIG. 5, the data signals (a1 to an) for the n channels may be input during the first input period, and the data signals (b1 to bn) for the n channels may be input during the second input period. At least some of the input data signals (a1 to an) may be output during the first input period, and at least some of the input data signals (b1 to bn) may be input during the second input period.

Referring to FIG. 4, the first latch unit 90 and the second latch unit 100 may each include n latches Latch 1_1 to Latch 1_n, Latch 2_1 to Latch 2_n, respectively. The first latch unit 90 and the second latch unit 100 may receive, as inputs, the shift register outputs S[1] to S[2n-1] of odd numbered ones S/R1, S/R3, . . . S/R2n-1 of the shift registers S/R1 to S/R2n of the shift register 80.

The first latch unit 90 may simultaneously and/or substantially simultaneously output the data (a1 to an) corresponding to the first input period input from the shift register unit 80, and the second latch unit 100 may simultaneously and/or substantially simultaneously output the data (b1 to bn) corresponding to the second input period input from shift register unit 80.

More particularly, as shown in FIG. 5, in the data driving circuit shown in FIG. 4, the data (a1 to an) corresponding to the first input period may be simultaneously and/or substantially simultaneously output through the first latch unit 90 and then, the data (b1 to bn) corresponding to the second input period may be simultaneously and/or substantially simultaneously output through the second latch unit 100.

More particularly, in some embodiments of the invention, the first latch Latch 1_1 of the n latches Latch 1_1 to Latch 1_n of the first latch unit 90 may employ the first shift register output S[1] of the first shift register S/R1 as an input, the second latch Latch 1_2 may employ the third shift register output S[3] of the third shift register S/R3 as an input, and the nth latch Latch 1_n may employ the 2n-1 shift register output S[2n-1] of the 2n-1 shift register S/R2n-1 as an input.

Similarly, in some embodiments of the invention, the first latch Latch 2_1 of the n latches Latch 2_1 to Latch 2_n of the second latch unit 100 may employ the first shift register output S[1] of the first shift register S/R1 as an input, the second latch Latch 2_2 may employ the third shift register output S[3] of the third shift register S/R3 as an input, and the nth latch Latch 2_n may employ the 2n-1 shift register output S[2n-1] of the 2n-1 shift register S/R2n-1 as an input.

Referring to FIG. 4, in some embodiments of the invention, the respective n latches Latch 1_1 to Latch 1_n of the first latch unit 90 may receive a first enable signal EN1 and a second enable signal EN2, and the respective n latches Latch 2_1 to Latch 2_n of the second latch unit 100 may receive a third enable signal EN3 and a fourth enable signal EN4.

In some embodiments of the invention, each of the latches Latch 1_1 to Latch 1_n and Latch 2-1 to Latch 2_n of the first and second latch units 90, 100, respectively, may employ a same circuit structure as that of the exemplary shift register S/R illustrated in FIG. 6. More particularly, e.g., in some embodiments of the invention, each of the latches Latch 1_1 to Latch 1_n and Latch 2_1 to Latch 2_n of the first and second latch units 90, 100, respectively, may include an input terminal (in), an output terminal (out), a first enable terminal (en) and a second enable terminal (/en), where the first and second enable terminals (en, /en) may correspond to the first and second clock terminals (clk, /clk) of the exemplary circuit illustrated in FIG. 6. Other exemplary embodiments of the latches latches Latch 1_1 to Latch 1_n and Latch 2_1 to Latch 2_n will be described below.

Thus, in such cases, the latches Latch 1_1 to Latch 1_n of the first latch unit 90 may receive the first enable signal EN1 through the first enable terminal (en), which may correspond to the first clock terminal (clk) of the exemplary circuit shown in FIG. 4, and the second enable signal EN2 through the second enable terminal (/en), which may correspond to the second clock terminal (/clk) of the exemplary circuit shown in FIG. 4. In some embodiments of the invention, the first and second enable signals EN1, EN2 may be respectively supplied to the first and second enable terminals (en, /en) of the latches Latch 1_1 to Latch 1_n irrespective of whether it is an even or odd numbered one of the latches Latch 1_1 to Latch 1_n.

Similarly, in such cases, the latches Latch 2_1 to Latch 2_n of the second latch unit 100 may receive the third enable signal EN3 through the first enable terminal (en), which may correspond to the first clock terminal (clk) of the exemplary circuit shown in FIG. 4, and may receive the fourth enable signal EN4 through the second enable terminal (/en), which may correspond to the second clock terminal (/clk) of the exemplary circuit shown in FIG. 4. In some embodiments of the invention, the third and fourth enable signals EN3, EN4 may be respectively supplied to the first and second enable terminals (en, /en) of the latches Latch 2_1 to Latch 2_n irrespectively of whether it is an even or odd numbered one of the latches Latch 2_1 to Latch 2_n.

Referring to FIG. 5, in some embodiments of the invention, the first enable signal EN1 and the second enable signal EN2 may maintain a low level and a high level, respectively, during all or substantially all of the first input period during which the data signals (a1 to an) may be input, and may maintain a high level and a low level, respectively, during all or substantially all of the second input period during which the data signals (b1 to bn) may be input.

Referring to FIG. 5, the first latch unit 90 may simultaneously and/or substantially simultaneously output the data signals (a1 to an), input during the first input period, during the second input period during which the first enable signal EN1 and the second enable signal EN2 may output at a high level and a low level, respectively.

With regard to the third and fourth enable signals EN3, EN4, the third enable signal EN3 and the fourth enable signal EN4 may maintain a low level and a high level, respectively, during all and/or substantially all of the second input period during which the data signals (b1 to bn) may be input, and may reversely sustain a high level and a low level, respectively, during all or substantially all of the third input period during which the data signals (c1 to cn) may be input.

Referring to FIG. 5, the second latch unit 100 may simultaneously and/or substantially simultaneously output the data (b1 to bn), which may be input during the second input period, during the third input period when the third enable signal EN3 and the fourth enable signal EN4 may be at a high level and a low level, respectively.

As shown in FIG. 5, in some embodiments of the invention, the second enable signal EN2 and the fourth enable signal EN4 may be controlled such that the second enable signal EN2 and the fourth enable signal EN4 are not simultaneously at a low level, i.e., a low level portion the second enable signal EN2 and a low level portion of the fourth enable signal EN4 do not overlap each other. Accordingly, there may be a gap in time between when the second enable signal EN2 is at a low level and when the fourth enable signal EN4 is at a low level.

Figure 7:
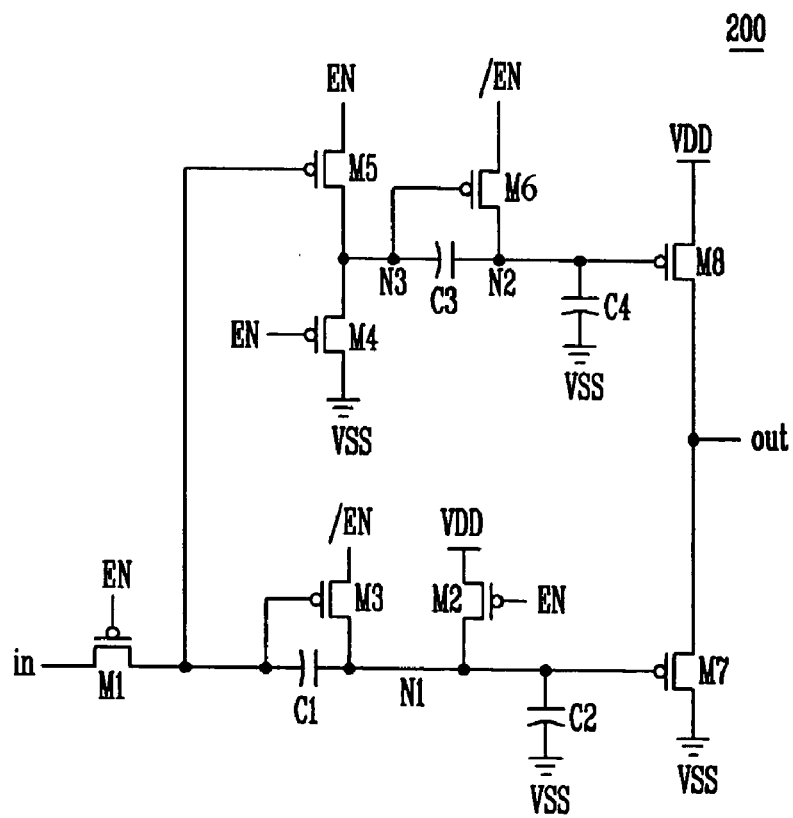
FIG. 7 illustrates a circuit diagram of an exemplary embodiment of a latch employable by a first latch unit and a second latch unit of the data driving circuit shown in FIG. 4.
Figure 8:
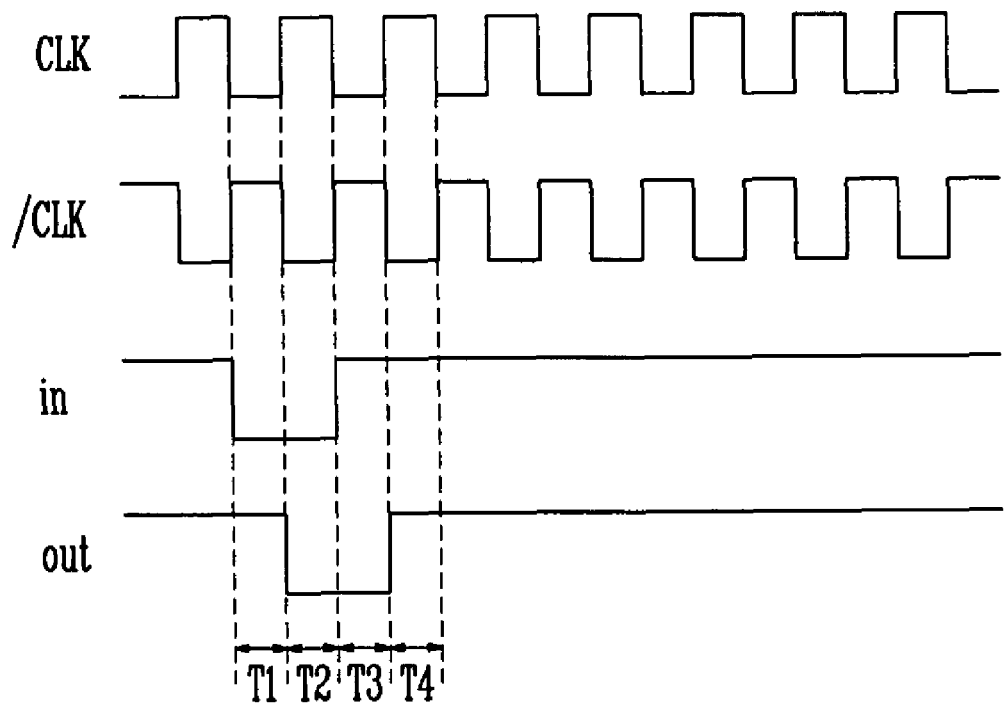
FIG. 8 illustrates an exemplary waveform diagram of signals employable for driving the exemplary latch shown in FIG. 7.

FIG. 7 illustrates a circuit diagram of an exemplary embodiment of a latch 200 employable by the first latch unit 90 and the second latch unit 100 of the data driving circuit shown in FIG. 4, and FIG. 8 illustrates an exemplary waveform diagram of signals employable for driving the exemplary latch shown in FIG. 7. That is, the latch 200 may be employed for one, some or all of the latches Latch 1_1 to Latch 1_n, Latch 2_1 to Latch 2_n of the first and second latch units 90, 100, respectively.

In the following description of an exemplary operation of the latch 200, clock signals rather than enable signals will be described as being input in the latch 200.

Referring to FIG. 7, the latch 200 according to an exemplary embodiment of the present invention may include a transfer unit, an inversion unit, and a buffer unit. The transfer unit may store an input signal (in) and then output the input signal (in). The inversion unit may store the input signal (in) and then, invert it before outputting it. The buffer unit may include a full-up transistor and a full-down transistor, may select a signal output from the transfer unit and the inversion unit, and may output the selected signal.

More particularly, the latch 200 may include a first PMOS transistor M1, a second PMOS transistor M2, a third PMOS transistor M3, a fourth PMOS transistor M4, a fifth PMOS transistor M5, a sixth PMOS transistor M6, a seventh PMOS transistor M7, an eighth PMOS transistor M8, a first capacitor C1, a second capacitor C2, a third capacitor C3 and a fourth capacitor C4. Although the first through eight transistors M1 to M8 shown in FIG. 7 are described as being PMOS transistors, the transistors are not limited to MOS transistors and may be any p-type transistor.

The first PMOS transistor M1 may receive an input signal (in) at a first electrode thereof. A gate electrode of the first PMOS transistor M1 may be connected to a first clock terminal (clk), and a second electrode of the first PMOS transistor M1 may be connected to a gate electrode of the fifth PMOS transistor M5, a first electrode of the first capacitor C1 and a gate electrode of the third PMOS transistor M3. A second electrode of the first capacitor C1 may be connected to a first node N1.

A first electrode of the second PMOS transistor M2 may be connected to the first power source voltage VDD and a second electrode the second PMOS transistor M2 may be connected to the first node N1. A gate electrode of the second PMOS transistor M2 may be connected to the first clock terminal (clk). A first electrode of the third PMOS transistor M3 may be connected to a second clock terminal (/clk) and a second electrode of the third PMOS transistor M3 may be connected to the first node N1. A first electrode of the second capacitor C2 may be connected to the first node N1 and a second electrode of the second capacitor C2 may be connected to the second power source voltage VSS.

A first electrode of the fourth PMOS transistor M4 may be connected to a third node N3, a gate electrode of the fourth PMOS transistor M4 may be connected to the first clock terminal (clk), and a second electrode of the fourth transistor M4 may be connected to the second power source voltage VSS. A first electrode of the fifth PMOS transistor M5 may be connected to the first clock terminal (clk), and a second electrode of the fifth PMOS transistor M5 may be connected to the third node N3.

A first electrode of the sixth PMOS transistor M6 may be connected to the second clock terminal (/clk) and a second electrode of the sixth PMOS transistor M6 may be connected to a second node N2. A gate electrode of the sixth PMOS transistor M6 may be connected to the third node N3. A first terminal of the third capacitor C3 may be connected to the third node N3 and a second terminal of the third capacitor C3 may be connected to the second node N2.

A first electrode of the fourth capacitor C4 may be connected to the second node N2 and a second electrode of the fourth capacitor C4 may be connected to the second power source voltage VSS. A gate electrode of the seventh PMOS transistor M7 may be connected to the first node N1, a first electrode of the seventh PMOS transistor M7 may be connected to an output terminal (out), and a second electrode of the seventh PMOS transistor M7 may be connected to the second power source voltage VSS.

A gate electrode of the eighth PMOS transistor M8 may be connected to the second node N2, a first electrode of the eighth PMOS transistor M8 may be connected to the second power source voltage VDD and a second electrode of the eighth PMOS transistor M8 may be connected to the output terminal (out).

The first capacitor C1 may be a data storage capacitor, and the second, third and fourth capacitors C2, C3 and C4 may be precharge capacitors. In some embodiments of the invention, the second capacitor C2 and the fourth capacitor C4 may inherently result from a parasitic capacitance, and thus, the second and fourth capacitors C2, C4 may be omitted.

For convenience of explanation, however, the latch 200 as shown in FIG. 7 and including the second and fourth capacitors C2, C4 will be further described below.

As described above, in some embodiments of the invention, the latch 200 may include the transfer unit, the inversion unit, and the buffer unit. The transfer unit may store the input signal (in) and then output the input signal (in). The transfer unit may include the first, second, third PMOS transistors M1, M2 and M3 and the first and second capacitors C1 and C2. The inversion unit may store the input signal (in) and may inverse the input signal (in) before outputting it. The inversion unit may include the first, fourth, fifth and sixth PMOS transistors M1, M4, M5 and M6 and the third and fourth capacitors C3 and C4. The buffer unit may select a signal output from the transfer unit and the inversion unit, and may output the selected signal. The buffer unit may include the seventh and eight PMOS transistors M7 and M8. In some embodiments of the invention, the second power source voltage VSS may be applied as a separate negative power source, while in some other embodiments of the invention, the second power source voltage VSS may correspond to a ground voltage GND.

Hereinafter, an exemplary operation of the latch 200 including the transfer unit, the inversion unit and the output unit, will be described with reference to FIGS. 7 and 8.

Although it is described that the first clock signal CLK as shown in FIG. 8 may be input through the first clock terminal (clk) and the second clock signal /CLK is input through the second clock signal (/clk), with regard to latches Latch 1_1 to Latch 1_n of the first latch unit 90, the first enable signal EN1 may be input through the first clock terminal (clK) and the second enable signal EN2 may be input through the second clock terminal (/clk). With regard to latches Latch 2_1 to Latch 2_n of the second latch unit 100, the third enable signal EN3 may be input through the first clock terminal (clk) and the fourth enable signal EN4 may be input through the second clock terminal (/clk).

Referring to FIG. 8, during a first interval Ti for driving the latch 200, the first clock signal CLK may be at a low level, the second clock signal /CLK may be at a high level, and the input signal (in) may be at a low level. Under such circumstances, the first and second PMOS transistor M1 and M2 of the transfer unit of the latch 200 may be turned, and the input signal (in) of a low level may be transferred to the gate of third PMOS transistor M3 as a result of the first PMOS transistor M1 being turned on. As a result of the low level state of the input signal (in), the third PMOS transistor M3 may also be turned on.

Under such circumstances, a voltage corresponding to a difference between the input signal (in) and the second clock signal /CLK, which may be input through the first terminal, i.e., source terminal, of the third PMOS transistor M3, may be stored in the first capacitor C1. Also, when the second PMOS transistor M2 is turned on, a charge corresponding to the first power source voltage VDD may be stored in the second capacitor C2.

Also, in the transfer unit of the latch 200, when the first PMOS transistor M1 is turned on, the input signal (in), which is currently assumed to have a low level, may be transferred to the gate electrode of the fifth PMOS transistor M5. Therefore, the fifth PMOS transistor M5 may be turned on and thus, the low level state of the first clock signal CLK being supplied to the first terminal of the fifth transistor M5 may be supplied to the third node N3. The fourth PMOS transistor M4 may also be turned on as a result of low level state of the first clock signal CLK being supplied to the gate electrode thereof and thus, the second power source voltage VSS may be supplied to the third node N3.

As a result of the low level state of the third node N3, the sixth PMOS transistor M6 may be turned on and a voltage of a high level corresponding to the second clock signal /CLK being supplied to the first electrode of the sixth transistor M6 may be supplied to the second node N2. Under such circumstances, the third capacitor C3 may be charged with a voltage corresponding to a difference between the voltage at the second node N2 and the voltage at the third node N3. That is, the amount charge stored in the third capacitor C3 may not be based on the voltage of the input signal (in). The fourth capacitor C4 may be charged with a high level voltage corresponding to the difference between the high level voltage of the second clock signal /CLK, which may be supplied to the first electrode of the sixth transistor M6, and the second power source voltage VSS.

Also, since the second capacitor C2 of the transfer unit of the latch 200 may be stored with the first power source voltage VDD and the fourth capacitor C4 of the inversion unit may be stored with the voltage of a high level via the second clock signal /CLK, the seventh and eighth PMOS transistor M7, M8 of the buffer unit of the latch 200 may be turned off. Thus, under such circumstances, the output (out) of latch 200 may be in a high impedance state and may sustain the output obtained in a previous interval.

That is, during the first interval T1, the latch 200 may be placed in a high impedance state and may sustain the output of a previous interval.

Referring to FIG. 8, during a second interval T2, the first clock signal CLK may be at a high level, the second clock signal /CLK may be at a low level, and the input signal (in) may be at a low level. Under such circumstances, the first and second PMOS transistors M1 and M2 of the transfer unit of the latch 200 may be turned off, and the third PMOS transistor M3 may be turned on as a result of a voltage, i.e., low voltage of input signal (in), stored in the first capacitor C1 during the first interval T1.

Accordingly, the second clock signal /CLK of a low level, which may be supplied via the source of third PMOS transistor M3, may be transferred to the first node N1 and thus, the second capacitor C2 may be charged with the low level voltage corresponding to the voltage state of the second clock signal /CLK during the second interval T2.

Also, in the transfer unit of the latch 200, the first, fourth and fifth PMOS transistors M1, M4 and M5 may be turned off, and the sixth PMOS transistor M6 may be turned on as a result of a voltage previously stored in the third capacitor C3. Thus, in some embodiments of the invention, a voltage of a high level corresponding to a high level state of the second clock signal /CLK during the second interval T2 may be supplied to the second node N2 and the fourth capacitor C4 connected to the second node N2 may be charged with a voltage of a high level.

Under such circumstances, because the second capacitor C2 of the transfer unit of the latch 200 may be charged with a voltage of a low level and the fourth capacitor C4 of the inversion unit of the latch 200 may be charged with a voltage of a high level, the seventh PMOS transistor M7 of the buffer unit of the latch 200 may be turned on and the eighth PMOS transistor M8 of the buffer unit of the latch 200 may be turned off. Thus, the second power source voltage VSS of a low level may be output, via the seventh PMOS transistor M7, to the output terminal (out) of the latch 200.

That is, as shown in FIG. 8, during the second interval T2 the latch 200 may be in a state so as to output a signal of a low level.

Referring to FIG. 8, during a third interval T3, the first clock signal CLK may be at a low level, the second clock signal /CLK may be at a high level, and the input signal (in) may be at a high level. Under such circumstances, the first and second PMOS transistors M1 and M2 of the transfer unit of the latch 200 may be turned on, and the input signal (in) of a high level may be transferred to the gate electrode of the third PMOS transistor M3 via the first PMOS transistor M1 being in an on state. Thus, the third PMOS transistor M3 may be turned off.

Under such circumstances, the first capacitor C1 may be charged with a voltage corresponding to a difference between the input signal (in) and the first power source voltage VDD, which may be supplied through a source electrode, e.g., the first electrode, of the second PMOS transistor M2. Also, as a result of the second PMOS transistor M2 being turned on, the second capacitor C2 may be charged with the first power source voltage VDD.

Also, in the transfer unit of the latch 200, the input signal (in) having a high level may be transferred to the gate electrode of the fifth PMOS transistor M5 via the first PMOS transistor M1 being in an on-state. Therefore, the fifth PMOS transistor M5 may be turned off. As a result of the low level of the first clock signal CLK, the fourth transistor M4 may be turned on and thus, a voltage of a low level corresponding to the second power source voltage VSS may be supplied to the third node N3, and the sixth PMOS transistor M6 may also be turned on.

As a result of the on-state of the sixth PMOS transistor M6, the voltage of a high level corresponding to the second clock signal /CLK may be supplied to the second node N2.

Under such circumstances, the third capacitor C3 may be charged with a voltage corresponding to a difference between the second node N2 having a high voltage and the third node N3 having a low voltage. In some embodiments of the invention, the amount of charge stored in the third capacitor C3 may not be dependent on a voltage of the input signal (in). The fourth capacitor C4 may be charged with a voltage corresponding to the first power source voltage VDD via the on-state of the sixth transistor M6.

During the third interval T3, the second capacitor C2 of the transfer unit of the latch 200 and the fourth capacitor C4 of the transfer unit may be charged with the first power source voltage VDD. Thus, the seventh and eighth PMOS transistors M7, M8 may be turned off, and the output terminal (out) of the latch 200 may be in a high impedance state, and may sustain the output of a previous interval.

That is, during the third interval T3 the latch 200 may be in a high impedance state and may sustain the output of a previous interval, e.g., output of the latch 200 during the second interval T2.

Referring to FIG. 4, during the fourth interval T4, the first clock signal CLK may be at a high level, the second clock signal /CLK may be at a low level, and the input signal (in) may be at a high level. Under such circumstances, the first and second PMOS transistors M1 and M2 of the transfer unit of the latch 200 may be turned off, and the third PMOS transistor M3 may be turned off via the voltage stored in the first capacitor C1 during the third interval T3. Thus, during the fourth interval T4, the first, second and third PMOS transistors M1, M2 and M3 of the transfer unit of the latch 200 may be turned off.

Under such circumstances, the fourth and fifth PMOS transistor M4, M5 may also be turned off via the high level of the first clock signal CLK and the high level of the input signal (in) respectively supplied to the gate electrodes thereof. The sixth transistor M6 may be turned on as a result of the voltage stored in the third capacitor C3 during the previous interval, e.g., the third interval T3. Thus, the low level voltage of the second clock signal /CLK may be supplied to the second node N2 and the fourth capacitor C4 may be charged with a corresponding low level voltage.

During the fourth interval T4, the second capacitor C2 may be in a floating state as a result of the off state of the first, second and third PMOS transistors M1, M2, M3 of the transfer unit of the latch 200. The fourth capacitor C4 may be charged with a low level corresponding to the low level state of the second clock signal /CLK. As a result, the seventh PMOS transistor M7 may be turned off and the eighth PMOS transistor M8 may be turned on. Therefore, a high level voltage corresponding to the first power source voltage VDD may be output to the output terminal out of the latch 200.

That is, as shown in FIG. 8, during the fourth interval T4, the latch 200 is in a state of outputting a signal of a high level.

In some embodiments of the invention, when the first clock signal CLK is at a low level and the second clock signal /CLK is at a high level, the latch 200 having, e.g., the circuit constitution shown in FIG. 7, may sustain a high impedance output state and may sustain the output of a previous interval, and when the first clock signal CLK is at a high level and the second clock signal /CLK is at a low level, the latch 200 may sustain a state of outputting a high level. The latch 200 employing one or more aspects of the invention may have a 3-Stage output state for outputting one of the same waveform as the input signal (in) and the same voltage state output during a previous interval.

That is, when the first enable signal EN1, which may be input through the first clock terminal (clk), is at a low level and the second enable signal EN2, which may be input through the second clock terminal (/clk), is at a high level, the latches Latch 1_1 to Latch 1_n of the first latch unit 90 may sustain a high impedance output state, i.e., may maintain the output of a previous interval, and when the first enable signal EN1 is at a high level and the second enable signal EN2 is at a low level, the latches Latch 1_1 to Latch 1_n may perform an operation to output the same waveform as that of the input signal (in), which may have been input and stored during the previous interval.

Also, when the third enable signal EN3, which may be input through the first clock terminal (clk), is at a low level and the fourth enable signal EN4, which may be input through the second clock terminal (/clk), is at a high level, latches Latch 2_1 to Latch 2_n of the second latch unit 100 may sustain a high impedance output state, i.e., may maintain the output of a previous interval, and when the third enable signal EN3 is at a high level and the fourth enable signal EN4 is at a low level, the latches Latch 2_1 to Latch 2_n may perform an operation to output the same waveform as that of the input signal (in), which may have been input and stored during the previous interval.

Referring to FIGS. 4, 5 and 7, an exemplary operation of the first latch unit 90 will be described below. For a period until the first data (a1) is output by from the a 2n-1 shift register S/R2n-1 during the first input period when each data signal (a1 to an) for the n channels may be input, and the data signals (a1 to an) may be output as the shift register output signals S[1] to S[2n-1] of the odd numbered ones S/R1, S/R3, . . . S/R2n-1 of the shift registers S/R1 to S/R2n, the first enable signal EN1 may be at a low level and the second enable signal EN2 may be at a high level and thus, the first latch unit 90 may be outputting a high impedance state. That is, during the first input period, the first latch unit 90 may receive and store data signals (a1 to an) for each of the n channels from the odd numbered ones S/R1, S/R3, . . . S/R2n-1 of the shift registers S/R1 to S/R2n, while sustaining the output of a previous interval. In embodiments of the invention, the first enable signal EN1 and the second enable signal EN2 may respectively be at a low level and high level during all or substantially all of the first input period.

Thereafter, as shown in FIG. 5, the first enable signal EN1 may have a high level and the second enable signal EN2 may have a low level after the first data signal (a1) is output via the 2n-1 th shift register S/R2n-1, and the voltage corresponding to the stored data signal a(1) may be simultaneously and/or substantially simultaneously output from the first latch unit 90.

That is, the first latch Latch 1_1 may store data (an) during the period when the first enable signal EN1 is at a low level and the second enable signal EN2 is at a high level, as shown in FIG. 5, and may thereafter output the voltage corresponding to the stored data signal (an) when the first enable signal EN1 is at a high level and the second enable signal EN2 is at a low level.

In a similar manner, the second to the nth latches Latch 1_2 to Latch 1_n may store data (an-1 to a1) during the period when the first enable signal EN1 is at a low level and the second enable signal EN2 is at a high level, as shown in FIG. 5, and may thereafter simultaneously or substantially simultaneously output the voltage corresponding to the stored data signal (an-1 to a1) when the first enable signal EN1 is at a high level and the second enable signal EN2 is at a low level.

An exemplary operation of the second latch unit 100 will be described below with reference to FIGS. 4, 5 and 7. For a period until the data signal (b1) is output by means of the 2n-1 shift register S/R2n-1 during the second input period when each of the data signals (b1 to bn) may be output as the shift register output signals S[1] to S[2n-1] of the odd numbered ones S/R1, S/R3, . . . S/R2n-1 of the shift registers S/R1 to S/R2n, the third enable signal EN3 may be at a low level and the fourth enable signal EN4 may be at a high level, the second latch unit 10-0 may be outputting a high impedance state. That is, during the second input period, the second latch unit 100 may receive and store data signals (b1 to bn) for each of the n channels from the odd numbered ones S/R1, S/R3, . . . S/R2n-1 of the shift registers S/R1 to S/R2n, while sustaining the output of a previous interval.

Thereafter, as shown in FIG. 5, when the third enable signal EN3 is at a high level and the fourth enable signal EN4 is at a low level after the data signal (b1) is output by the 2n-1 shift register S/R2n-1, the voltage corresponding to the stored data signal may be simultaneously and/or substantially simultaneously output from the latches Latch2_1 to Latch2_n.

More particularly, e.g., the first latch Latch 2_1 may store data (bn) during the second input period when the third enable signal EN3 is at a low level and the fourth enable signal EN4 is at a high level, as shown in FIG. 5. Thereafter, the first latch Latch 2_1 may output the voltage corresponding to the stored data signal (bn) when the third enable signal EN3 may be at a high level and the fourth enable signal EN4 may be at a low level, e.g., during the third input period.

In the same manner, the second to nth latches Latch 2_2 to Latch 2_n may respectively store data (bn-1 to b1) during the second input period when the third enable signal EN3 may be at a low level and the fourth enable signal EN4 may be at a high level, as shown in FIG. 5. Thereafter, the second to nth latches Latch 2_2 to Latch 2_n may output the respective voltage corresponding to the respectively stored data signal (bn-1 to b1) when the third enable signal EN3 may be at a high level and the fourth enable signal EN4 may be at a low level, e.g., during the third input period.

As shown in FIG. 5, the first latch unit 90 may simultaneously and/or substantially simultaneously output the first data (a1 to an) corresponding to the first input period during the second input period when the first enable signal EN1 and the second enable signal EN2 may be at a high level and a low level, respectively. Further, as shown in FIG. 5, the second latch unit 100 may simultaneously output the data (b1 to bn), corresponding to the second input period, during the third input period when the third enable signal EN3 and the fourth enable signal EN4 may be at a high level and a low level, respectively.

Figure 9:
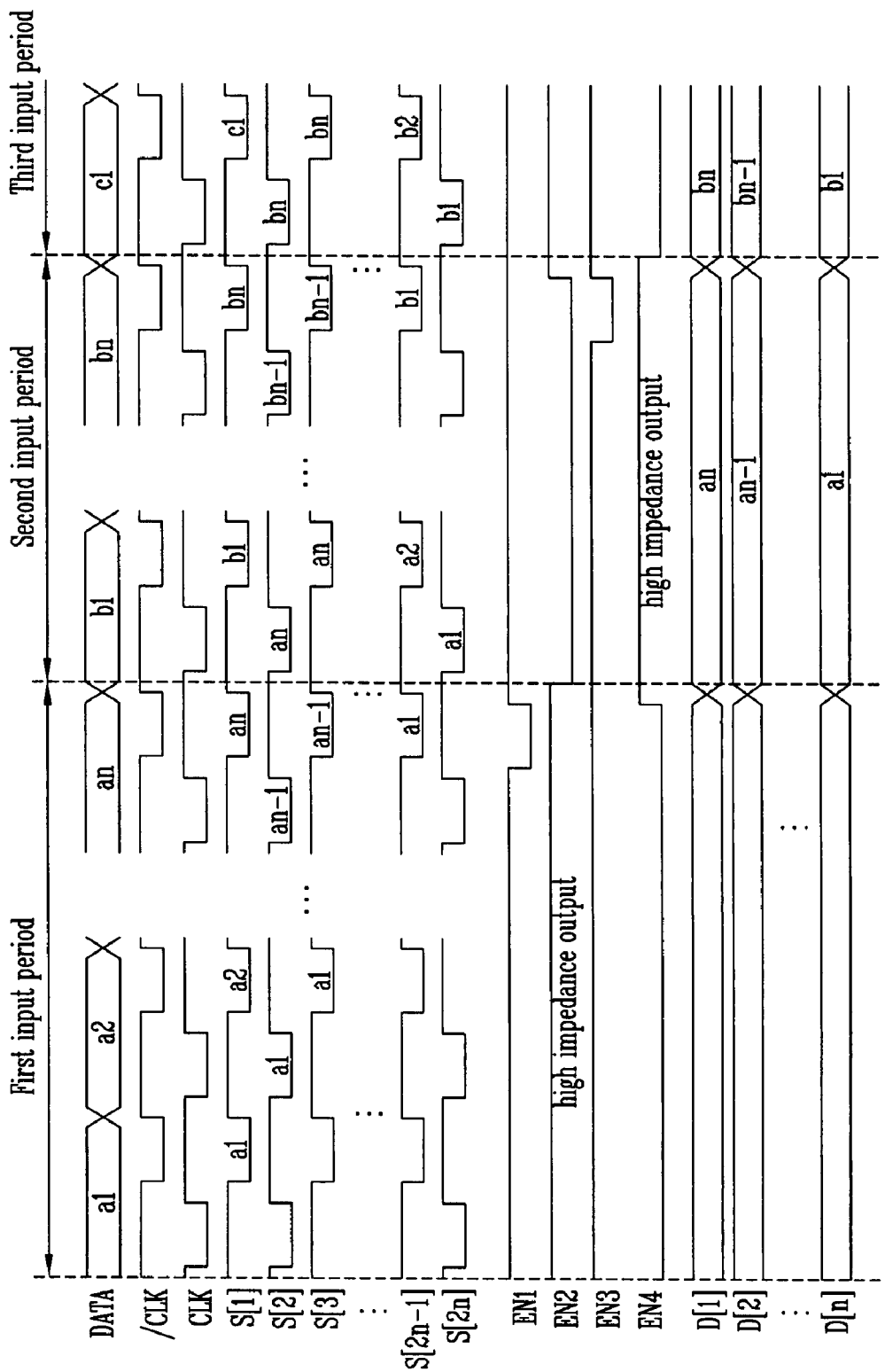
FIG. 9 illustrates an exemplary waveform diagram of signals employable by a second exemplary method for driving the data driving circuit shown in FIG. 4.

FIG. 9 illustrates an exemplary waveform diagram of signals employable by a second exemplary method for driving the data driving circuit shown in FIG. 4.

The exemplary embodiment of the signal waveforms illustrated in FIG. 9 substantially correspond to the exemplary signal waveforms illustrated in FIG. 5. In general, only differences between the exemplary embodiments illustrated in FIGS. 5 and 9 and will be described below. In particular, differences between the exemplary embodiments illustrated in FIGS. 5 and 9 substantially exist with regard to the first enable signal EN1 and the third enable signal EN3.

In the exemplary embodiment shown in FIG. 5, the first enable signal EN1 may be continuously and/or substantially continuously sustained a low level during the first input period, until the data signal (a1) is output by the 2n-1 shift register S/R2n-1. More particularly, in some embodiments of the invention, the data that each of the latches is to store is a respective data signal output by each of the odd numbered ones of the shift registers at a time when the data signal (a1) is output by the 2n-1 shift register S/R2n-1.

The exemplary embodiment illustrated in FIG. 9 employs this scenario to help reduce power consumption by continuously charging and discharging the first capacitor C1 of the respective latch(es). More particularly, in the exemplary embodiment shown in FIG. 9, a low level may be input only for the period of the first input period during which the data signal (a1) is output by the 2n-1 shift register S/R2n-1 and thus, the first capacitor C1, i.e., the data storage capacitor, of the latch may be more selectively charged and discharged, and may thereby reduce power consumption.

In the same manner, the third enable signal EN3 may output a low level only for the period of the second input period when the data signal (b1) is output by means of the 2n-1 shift register S/R2n-1. That is, the respective enable signal, e.g., the first enable EN1, the third enable signal EN3, may be controlled so as to output a low level for a shorter time period than that of the first exemplary embodiment illustrated in FIG. 5. More particularly, in some embodiments of the invention, the first enable signal EN1 and the third enable signal EN3 may output a low level a time period corresponding to when the respective data signal is to be output from the latch, e.g., output from the last of the odd numbered latches.

Figure 10:
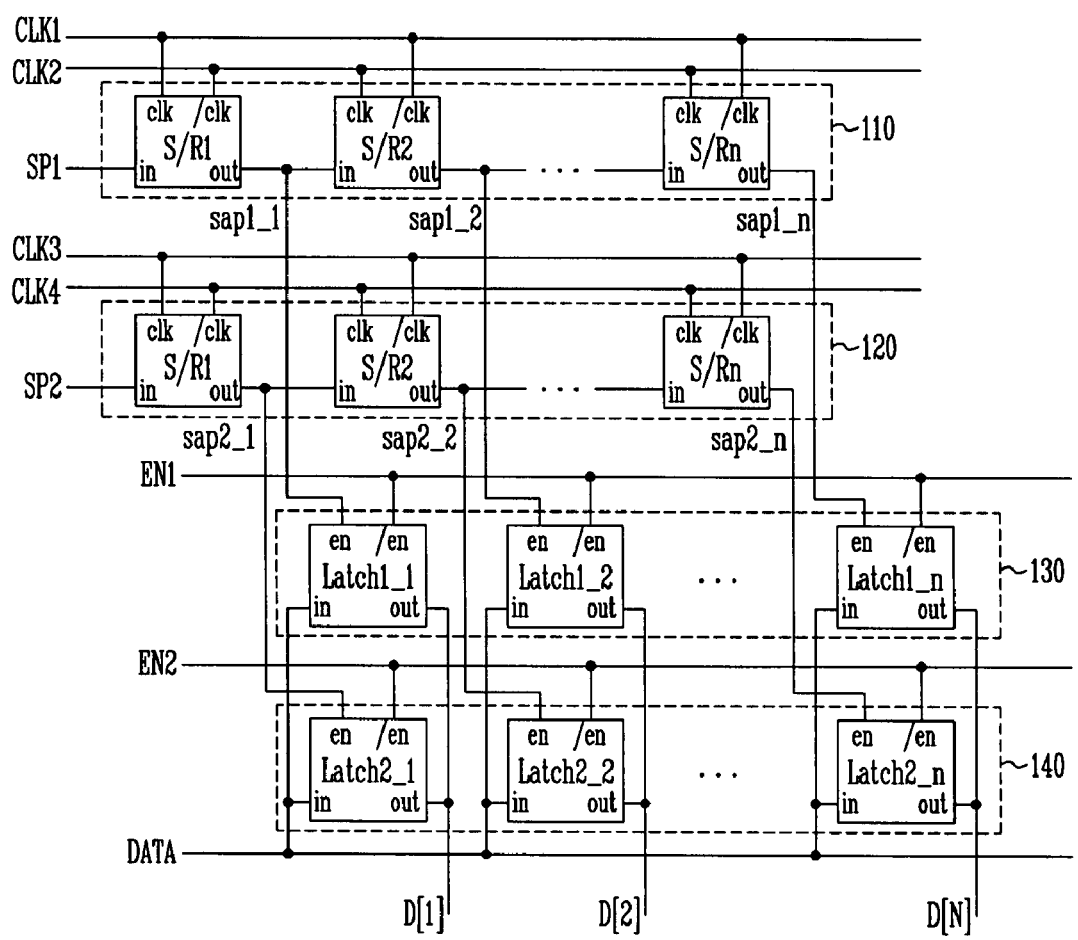
FIG. 10 illustrates a block diagram of a second exemplary embodiment of a data driving circuit employing one or more aspects of the present invention.
Figure 11:
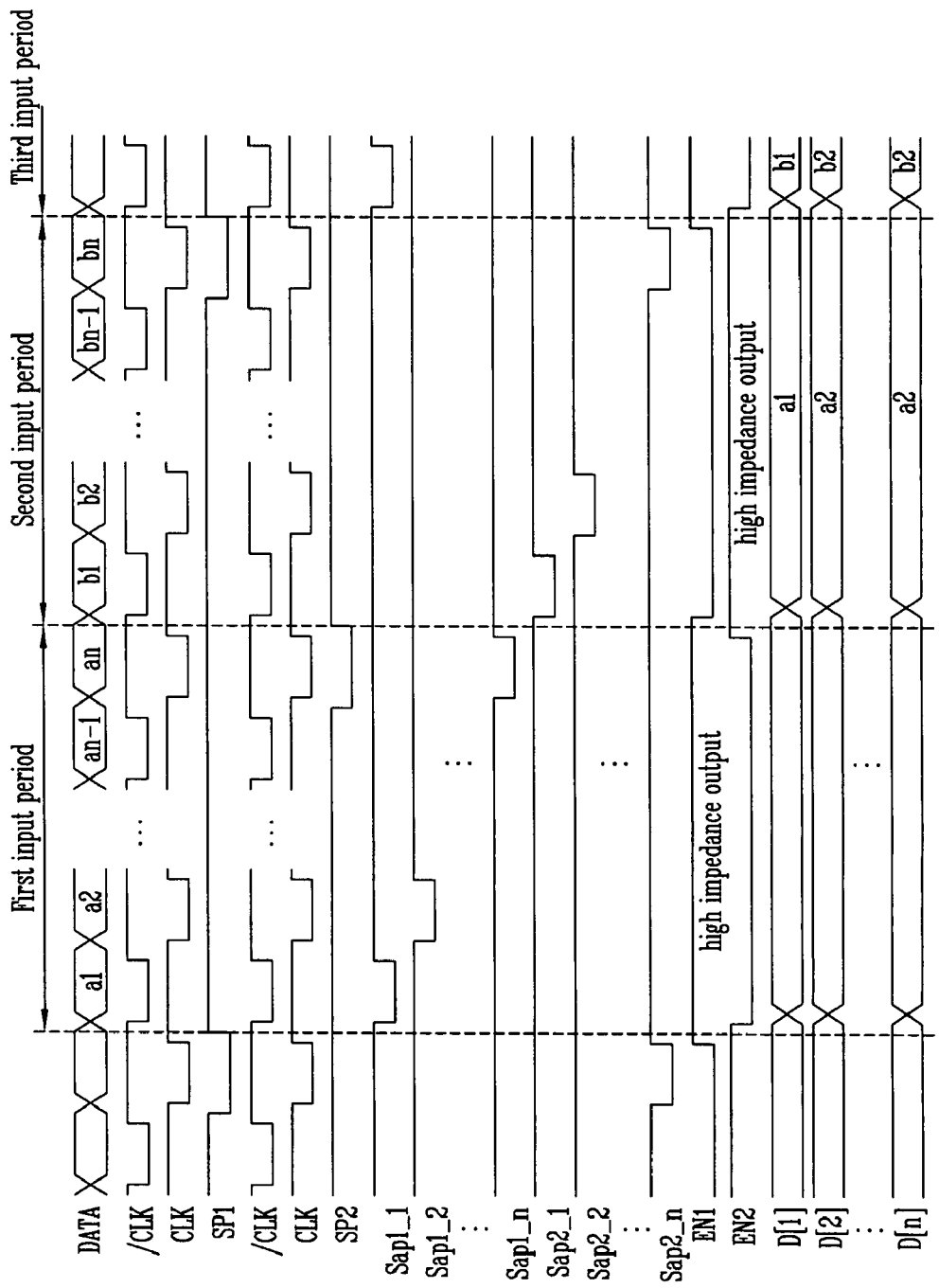
FIG. 11 illustrates an exemplary waveform diagram of signals employable by a first exemplary method for driving the data driving circuit shown in FIG. 10.

FIG. 10 illustrates a block diagram of a second exemplary embodiment of a data driving circuit employing one or more aspects of the present invention. FIG. 11 illustrates an exemplary waveform diagram of signals employable by a first exemplary method for driving the data driving circuit shown in FIG. 10.

For description purposes, it is assumed that the data driving circuit comprises n channels. However, embodiments of the invention are not limited to n channels.

Referring to FIG. 10, a data driving circuit according to the second exemplary embodiment of the present invention may include a first shift register 110', a second shift register 120, a first latch unit 130, and a second latch unit 140.

The first shift register 110 may sequentially output a sampling pulse sap1_1 to sap1_n corresponding to a first input period in accordance with a first clock signal CLK1, a second clock signal CLK2 and a first start pulse SP1. The second shift register 120 may sequentially output a sampling pulse sap2_1 to sap2_n corresponding to a second input period in accordance with a third clock signal CLK3, a fourth clock signal CLK4 and a second start pulse SP2. The first latch unit 130 may simultaneously and/or substantially simultaneously output a data signal input during a first input period in accordance with a first enable signal EN1 and the respective sampling pulse sap1_1 to sap1_n from the first shift register 110. The second latch unit 140 may simultaneously and/or substantially simultaneously output a data signal input during the second input period in accordance with a second enable signal EN2 and a sampling pulse sap2_1 to sap2_n from the second shift register 120.

The first shift register 110 may include n shift registers S/R1 to S/Rn connected in series. The first shift register S/R1 may receive each first start pulse SP1, and the second to the nth shift registers S/R2 to S/R2n may receive an output signal of a previous shift register, e.g., sap1_1 to sap1_n-1.

The shift registers S/R1 to S/Rn of the first shift register unit 110 may receive the first clock signal CLK1 and the second clock signal CLK2. However, in some embodiments of the invention, odd numbered ones of the shift registers S/R1 to S/Rn may receive the first clock signal CLK1 through a first clock terminal (clk) thereof and may receive the second clock signal /CLK through a second clock terminal (/clk) thereof, and even numbered ones of the shift registers S/R1 to S/Rn may receive the second clock signal CLK2 through a first clock terminal (clk) thereof and may receive the first clock signal CLK1 through a second clock terminal (/clk) thereof.

In the same manner, the second shift register 120 may include n shift registers S/R1 to S/Rn connected in series. The first shift register S/R1 may receive each second start pulse SP2, and the second to the nth shift registers S/R2 to S/R2n may receive an output signal of a previous shift register, e.g., sap2_1 to sap2_n-1.

The shift registers S/R1 to S/Rn of the second shift register unit 120 may receive the third clock signal CLK3 and the fourth clock signal CLK4. However, in some embodiments of the invention, odd numbered ones of the shift registers S/R1 to S/Rn may receive the third clock signal CLK3 through a first clock terminal (clk) thereof and may receive a fourth clock signal CLK4 through a second clock terminal (/clk) thereof, and even numbered ones of the shift registers S/R1 to S/Rn may receive the fourth clock signal CLK4 through a first clock terminal (clk) thereof and may receive the third clock signal CLK through a second clock terminal (/clk) thereof.

At this time, the first and the third clock signals CLK1, CLK3 may substantially and/or completely correspond to each other, and the second and the fourth clock signals CLK2, CLK4 may substantially and/or completely correspond to each other.

One, some or all of the shift registers S/R1 to S/Rn of the first and the second shift register units 110 and 120 may have the same circuit, e.g., the exemplary circuit shown in FIG. 6. Thus, a repetitive detailed description of the operation thereof will be omitted below.

In embodiments of the invention, as shown in FIG. 11, each of the first and the second shift register units 110,120 may sequentially output sampling pulses sap1_1 to sap 1_n corresponding to a first input period, and may sequentially output sampling pulses sap2_1 to sap2_n corresponding to a second input period.

Accordingly, the sampling pulses sap1_1 to sap1_n that may be output by the first shift register unit 110 may be input to respective latches Latch1_1 to Latch 1_n of the first latch unit 130, and the sampling pulses sap2_1 to sap2_n that may be output by the second shift register unit 120 may be input to respective latches Latch2_1 to Latch2_n of the second latch unit 140.

In some embodiments of the invention, one, some or all of the latches Latch 1_1 to Latch 1_n, Latch 2_1 to Latch 2_n, provided in the first latch unit 130 and the second latch unit 140 may have the same circuit, e.g., the exemplary circuit shown in FIG. 7. Thus, a repetitive detailed description of the operation thereof will be omitted below.

However, the respective latches Latch1_1 to Latch 1_n of the first latch unit 130 may receive the sampling pulses sap1_1 to sap1_n from the first shift register 110 and the first enable signal EN1 with a waveform as shown in FIG. 11, and may then simultaneously and/or substantially simultaneously output the data signal (a1) to an input during the first input period.

That is, referring to FIG. 11, the first latch Latch 1_1 of the first latch unit 130 may store the data signal (a1) for the period when the first sampling signal sap1_1 is at a low level and the first enable signal EN1 is at a high level. The first latch Latch 1_1 may then output a voltage corresponding to the prestored data signal (a1) when the first enable signal EN1 becomes a low level.

Similarly, each of the second to the nth latches Latch 1_2 to Latch 1_n may respectively store data (a2 to an) during the period when the second to the nth sampling signals (sap1_2 to sap1_n) are at a low level and the first enable signal EN1 is at a high level. Then, as shown in FIG. 11, when the first enable signal EN1 changes to a low level, the second to the nth latches Latch 1_2 to Latch 1_n may then simultaneously and/or substantially simultaneously output a voltage corresponding the prestored data signal (a2 to an) respectively stored therein.

The respective latches Latch 2_1 to Latch 2_n of the second latch unit 140 may receive the sampling pulses sap2_1 to sap2_n from the second shift register 120 and the second enable signal EN2 having, e.g., the waveform shown in FIG. 11, and may then simultaneously and/or substantially simultaneously output the data (b1 to bn) input during the second input period.

That is, referring to FIG. 11, the first latch Latch 2_1 of the second latch unit 140 may store data (b1) during the period when the first sampling signal sap2_1 is at a low level and the second enable signal EN2 is at a high level, and may thereafter output a voltage corresponding to the prestored data signal (b1) when the second enable signal EN2 changes to a low level.

Similarly, each of the second to the nth latches Latch 2_2 to Latch 2_n may store data (b2 to bn) during the period when the second to the nth sampling signals sap2_2 to sap2_n are at a low level and the second enable signal EN2 is at a high level, and thereafter, when the first enable signal EN1 changes to a low level, may simultaneously and/or substantially simultaneously output the voltage corresponding to the prestored data signals (b2 to bn), as shown in FIG. 11.

Figure 12:
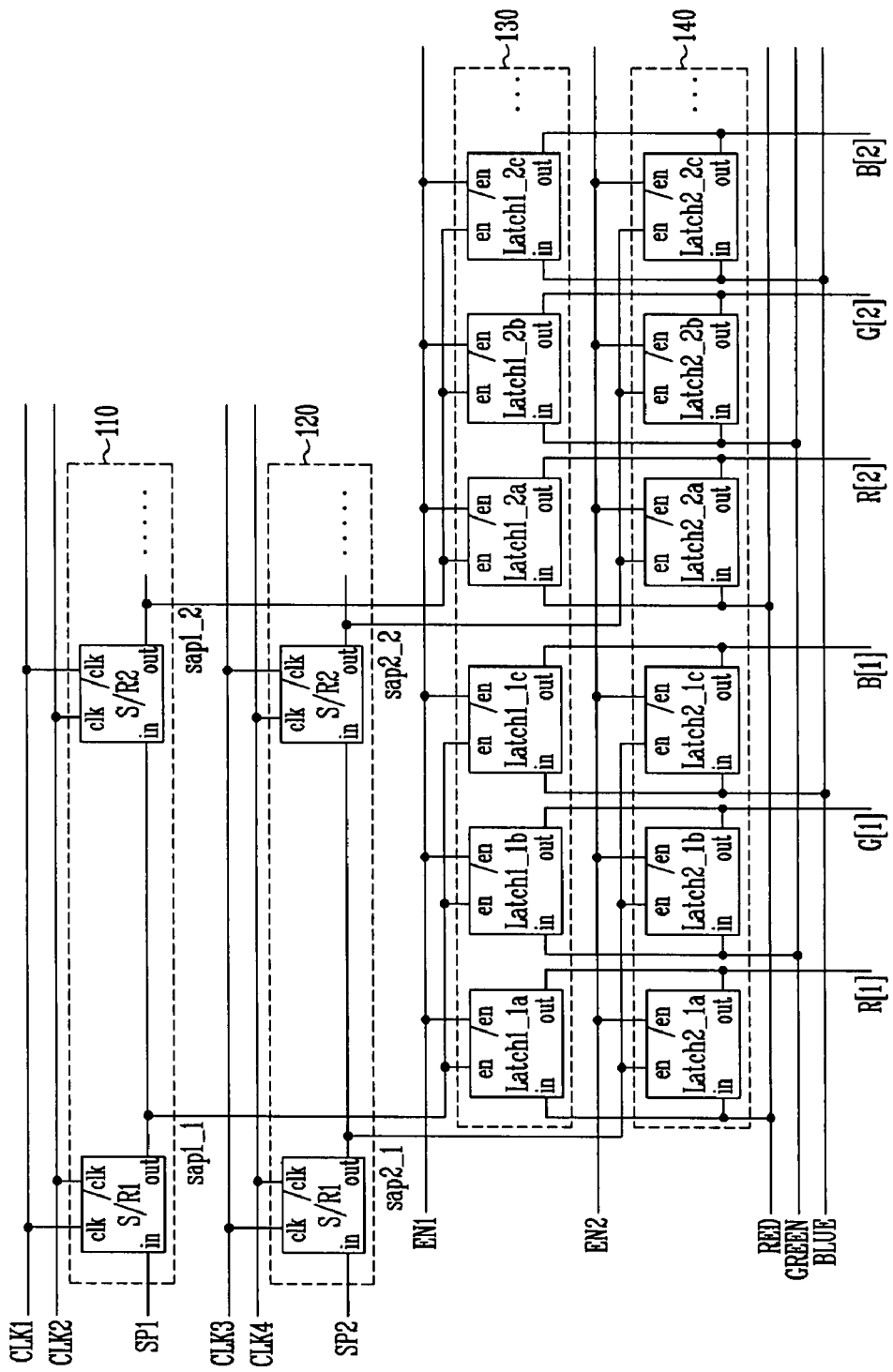
FIG. 12 illustrates a block diagram of a third exemplary embodiment of a data driving circuit employing one or more aspects of the present invention.

FIG. 12 illustrates a block diagram of a third exemplary embodiment of a data driving circuit employing one or more aspects of the present invention. The third exemplary data driving circuit substantially corresponds to the second exemplary data driving circuit shown in FIG. 10. Thus, in general only differences between the third exemplary data driving circuit shown in FIG. 10 and the second exemplary data driving circuit shown in FIG. 12 will be described below.

As discussed above and shown in FIG. 10, in the second exemplary data driving circuit, data signals D[1] to D[n] including data relating to red, green and blue are respectively supplied to each of the n channels. That is, e.g., in the second exemplary data driving circuit, the first channel may be associated with the first latch of the first and second latch units 130, 140. In the third exemplary embodiment, each of the n channels may receive three data signals corresponding to a red data signal R[n], a green data signal G[n], and a blue data signal B[n]. That is, e.g., in the third exemplary data driving circuit shown in FIG. 12, the data driving circuit may include a first latch unit 130' and a second latch unit 140' including three latches for each of the n channels. For example, in the third exemplary data driving circuit, the first channel may be associated with latches Latch1_1a, Latch 1_1b and Latch 1_1c of the first latch unit 130' and latches Latch 2_1a, Latch 2_1b and Latch 2_1c of the second latch unit 140'. More particularly, e.g., the 1a latch Latch1_1a of the first latch unit 130' and the 1a latch Latch.2_1a of the second latch unit 140' may be associated with red data R[1] for the first channel, the 1b latch Latch1_1b of the first latch unit 130' and the 1b latch Latch2_1b of the second latch unit 140' may be associated with green data G[1] for the first channel, and the 1c latch Latch1_1c of the first latch unit 130' and the 1c latch Latch2_1c of the second latch unit 140' may be associated with the blue data B[1] for the first channel.

That is, the data driving circuit according to the third exemplary embodiment shown in FIG. 12 may include the first shift register 110, the second shift register 120, the first latch unit 130' and the second latch unit 140'. The first shift register 110 may sequentially output the sampling pulse sap1_1, sap1_2 . . . sap1_n corresponding to the first input period in accordance with the first clock signal CLK1, the second clock signal CLK2 and the first start pulse SP1. The second shift register 120 may sequentially output the sampling pulse sap2_1, sap2_2 . . . sap2_2n corresponding to the second input period in accordance with the third clock signal CLK3, the fourth clock signal CLK4 and the second start pulse SP2. As described above, the first latch unit 130' and the second latch unit 140' may each include three latches for each channel of the circuit, i.e., each of the first latch unit 130' and the second latch unit 140' may include 3*n latches. Other than these features of the first and second latch unit 130', 140', the, constitution and the operation of the third exemplary data driving circuit may be the same as those of the second exemplary data driving circuit previously described with reference to FIG. 10, and thus, the detailed description thereof will be omitted.

As described above, embodiments of the invention may provide a shift register, a data driver and an organic light emitting display using the same according that are configured of only PMOS transistors, resulting in that the data driver may be mounted on a panel and the manufacturing expense can be reduced accordingly. Also, in embodiments of the present invention, the data driver may supply a first data signal or a second data signal as a data signal, resulting in that the data driving circuit may be employed to digitally drive an organic light emitting display.

The detailed description and the drawings of the present invention are illustrated, by way of example, to describe the present invention, rather than limiting the meanings of the present invention or the scope of the present invention defined in the claims.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A data driving circuit including n channels, where n is an integer, the data driving circuit comprising:
   a shift register unit receiving data during a first input period and a second input period, the shift register unit shifting and outputting the received data;
   a first latch unit receiving the data input during the first input period from the shift register unit, and simultaneously or substantially simultaneously outputting the data corresponding to the first input period; and
   a second latch unit receiving the data input during the second input period from the shift register unit, and simultaneously or substantially simultaneously outputting the data corresponding to the second input period,
   wherein the shift register unit includes 2n shift registers connected in series, and
   wherein among the plurality of 2n shift registers,
   odd numbered ones of the shift registers receive a first clock signal through a first clock terminal thereof and receive a second clock signal through a second clock terminal thereof, and
   even numbered ones of the registers receive the second clock signal through a first clock terminal thereof and receive the first clock signal through a second clock terminal thereof.

2. The data driving circuit as claimed in claim 1, wherein the first shift register receives a data signal, and the second to the 2n shift registers receive an output signal of a previous shift register.

3. The data driving circuit as claimed in claim 1, wherein each of the 2n shift registers comprises:
   a first transistor receiving the data at a first electrode thereof and having a gate connected to a first clock terminal;
   a second transistor connected between a second clock terminal and an output terminal and having a gate connected with a second electrode of the first transistor;
   a third transistor and a fourth transistor connected between the first clock terminal and a second power source, a first electrode of the third transistor being connected to a first electrode of the fourth transistor, a gate of the fourth transistor being connected to the second terminal of the first transistor, and a gate electrode of the third transistor being connected to the first clock terminal;
   a fifth transistor connected between a first power source and an output terminal and having a gate connected to the first electrodes of the third and fourth transistors; and
   a capacitor connected between the gate and the output terminal.

4. The data driving circuit as claimed in claim 3, wherein the data is an externally supplied data signal or an output of a previous one of the shift registers.

5. The data driving circuit as claimed in claim 3, wherein the first, second, third, fourth and fifth transistors are p-type transistors.

6. The data driving circuit as claimed in claim 1, wherein the first latch unit and the second latch unit each include n latches and receive, as input signals thereto, respective outputs of odd numbered ones of the 2n shift registers of the shift register unit.

7. The data driving circuit as claimed in claim 6, wherein each of the latches includes:
   a transfer unit for storing and then outputting an input signal input thereto;
   an inversion unit for storing and inversing the input signal input to the transfer unit and outputting the inversed input signal; and
   a buffer unit, including a pull-up transistor and a pull-down transistor, for selecting a signal output from at least one of the transfer unit and the inversion unit and outputting the selected signal.

8. The data driving circuit as claimed in claim 6, wherein each of the latches includes:

a first transistor receiving the respective input signal at a first electrode thereof, the first transistor including a gate connected to a first clock terminal;
a second transistor connected between a first power source and a first node and having a gate connected with the first clock terminal;
a third transistor connected between a second clock terminal and the first node and having a gate connected with a second electrode of the first transistor;
a fourth transistor connected between a second power source and a third node and having a gate connected with the first clock terminal;
a fifth transistor connected between the first clock terminal and the third node and having a gate connected with the second electrode of the first transistor;
a sixth transistor connected between the second clock terminal and a second node and having a gate connected with the third node;
a seventh transistor connected between the second power source and an output terminal and having a gate connected with the first node; and
an eighth transistor connected between the first power source and the output terminal and having a gate connected with the second node.

9. The data driving circuit as claimed in claim 8, wherein each of the first, second, third, fourth, fifth, sixth, seventh, eighth and ninth transistors is a p-type transistor.

10. The data driving circuit as claimed in claim 8, wherein each of the latches further includes:
a first capacitor connected between the second electrode of the first transistor and the first node; and
a third capacitor connected between the second node and the third node.

11. The data driving circuit as claimed in claim 10, wherein each of the latches further includes:
a second capacitor connected between the first node and the second power source; and
a third capacitor connected between the second node and the second power source.

12. The data driving circuit as claimed in claim 6, wherein each latch provided in the first latch unit receives a first enable signal and a second enable signal, and each latch provided in the second latch unit receives a third enable signal and a fourth enable signal.

13. The data driving circuit as claimed in claim 12, wherein the first enable signal and the second enable signal sustain a low level and a high level, respectively, during all or substantially all of the first input period, and sustain a high level and a low level, respectively, during all or substantially all of the second input period.

14. The data driving circuit as claimed in claim 13, wherein the first latch unit simultaneously or substantially simultaneously outputs the data corresponding to the first input period during all or substantially all of the second input period when the first enable signal and the second enable signal are at a high level and a low level, respectively.

15. The data driving circuit as claimed in claim 12, wherein the third enable signal and the fourth enable signal sustain a low level and a high level, respectively, during all or substantially all of the second input period, and sustain a high level and a low level, respectively, during a third input period.

16. The data driving circuit as claimed in claim 15, wherein the second latch unit simultaneously or substantially simultaneously outputs the data corresponding to the second input period during the third input period when the third enable signal and the fourth enable signal are at a high level and a low level, respectively.

17. The data driving circuit as claimed in claim 12, wherein:
during the first period, the first enable signal is at the low level only for a period when a first data of the data input during the first input period is output by the 2n-1 shift register of the 2n shift registers, and
during the second period, the third enable signal is at the low level only for a period when a first data of the data input during the second input period is output by the 2n-1 shift register of the 2n shift registers.

18. The data driving circuit as claimed in claim 12, wherein the second enable signal and the fourth enable signal maintain a low level at different periods in time.

19. A data driving circuit including n channels, where n is an integer, the data driving circuit comprising:
a shift register unit receiving data during a first input period and a second input period, the shift register unit shifting and outputting the received data;
a first latch unit receiving the data input during the first input period from the shift register unit, and simultaneously or substantially simultaneously outputting the data corresponding to the first input period; and
a second latch unit receiving the data input during the second input period from the shift register unit, and simultaneously or substantially simultaneously outputting the data corresponding to the second input period,
wherein the shift register unit includes:
a first shift register unit for outputting first sampling pulses corresponding to the data received during the first input period based on a first clock signal, a second clock signal and a first start pulse, and
a second shift register unit for outputting second sampling pulses corresponding to the data received during the second input period based on a third clock signal, a fourth clock signal and a second start pulse, and
wherein:
the first latch unit simultaneously or substantially simultaneously outputs data corresponding to the first input period in accordance with a first enable signal and the first sampling pulses from the first shift register unit; and
the second latch unit simultaneously or substantially simultaneously outputs data corresponding to the second input period in accordance with a second enable signal and the second sampling pulses from the second shift register unit.

20. The data driving circuit as claimed in claim 19, wherein:
the first shift register includes n shift registers connected in series, a first shift register thereof receiving each first start pulse and the second to the nth shift registers receiving the respective sampling pulse of a previous one of the shift registers, and
the second shift register includes n shift registers connected in series, a fist shift register thereof receiving each second start pulse, and the second to the nth shift registers receiving the respective sampling pulse of a previous one of the shift registers.

21. The data driving circuit as claimed in claim 19, wherein:
the first latch unit includes a plurality of latches and each of the latches outputs data input during the first input period in accordance with the first sampling pulses and the first enable signal, and
the second latch unit includes a plurality of latches and each of the latches outputs data input during the second input period in accordance with the second sampling pulses and the second enable signal.

22. An organic light emitting display, comprising:
a scan driver for sequentially supplying scan signals to scan lines;
a data driver for supplying a first data signal or a second data signal to respective data lines; and
pixels selected when the scan signals are supplied and controlled to emit or not emit light based on whether the first data signal or the second data signal is respectively supplied thereto,
wherein the data driver includes:
- a shift register unit receiving data during a first input period and a second input period, the shift register unit shifting and outputting the received data;
- a first latch unit receiving the data input during the first input period from the shift register unit, and simultaneously or substantially simultaneously outputting the data corresponding to the first input period; and
- a second latch unit receiving the data input during the second input period from the shift register unit, and simultaneously or substantially simultaneously outputting the data corresponding to the second input period, wherein the shift register unit includes 2n shift registers connected in series, and wherein among the plurality of 2n shift registers,
odd numbered ones of the shift registers receive a first clock signal through a first clock terminal thereof and receive a second clock signal through a second clock terminal thereof, and
even numbered ones of the registers receive the second clock signal through a first clock terminal thereof and receive the first clock signal through a second clock terminal thereof.

* * * * *